(12) United States Patent
Sharon et al.

(10) Patent No.: US 8,756,365 B2
(45) Date of Patent: Jun. 17, 2014

(54) APPARATUS AND METHOD FOR ENHANCING FLASH ENDURANCE BY ENCODING DATA

(75) Inventors: Eran Sharon, Rishon Lezion (IL); Simon Litsyn, Giv'at Shmuel (IL); Idan Alrod, Herzliya (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 289 days.

(21) Appl. No.: 13/148,738

(22) PCT Filed: Feb. 11, 2010

(86) PCT No.: PCT/IB2010/050621
§ 371 (c)(1),
(2), (4) Date: Aug. 10, 2011

(87) PCT Pub. No.: WO2010/092536
PCT Pub. Date: Aug. 19, 2010

(65) Prior Publication Data
US 2013/0191579 A1     Jul. 25, 2013

Related U.S. Application Data

(60) Provisional application No. 61/152,218, filed on Feb. 12, 2009.

(51) Int. Cl.
*G06F 12/00* (2006.01)
(52) U.S. Cl.
USPC ........................................ 711/103; 341/50

(58) Field of Classification Search
CPC .............. G06F 12/00; G06F 17/30324; G06F 9/30018; G06F 2212/40
USPC ............ 711/103; 341/50, 51, 59, 63, 67, 102, 341/101
See application file for complete search history.

(56) References Cited

U.S. PATENT DOCUMENTS

| | | | | |
|---|---|---|---|---|
| 5,973,626 | A * | 10/1999 | Berger et al. | 341/65 |
| 7,697,606 | B2 * | 4/2010 | Ungerboeck et al. | 375/240 |
| 2004/0143699 | A1 * | 7/2004 | Norman | 711/103 |
| 2006/0290539 | A1 * | 12/2006 | Tomic | 341/50 |
| 2008/0031042 | A1 | 2/2008 | Sharon | |
| 2008/0158948 | A1 | 7/2008 | Sharon et al. | |

OTHER PUBLICATIONS

Arm, "Flash Programming", May 2003, Arm Limited 2003.*
International Search Report and Written Opinion for Application No. PCT/IB2010/050621 dated Apr. 13, 2010.
International Preliminary Report on Patentability for Application No. PCT/IB2010/050621 dated Aug. 16, 2011.

(Continued)

*Primary Examiner* — Aimee Li
*Assistant Examiner* — Christopher Do
(74) *Attorney, Agent, or Firm* — Alston & Bird LLP

(57) ABSTRACT

Input bits are stored in memory cells by mapping the input bits into a larger number of transformed bits using a shaping encoding that has a downward asymptotic bias with respect to a mapping of bit patterns to cell states and programming some of the cells according to that mapping of bit patterns to cell states. The programmed cells are erased before being programmed to store any other bits. The invention sacrifices memory capacity to increase endurance.

28 Claims, 25 Drawing Sheets

(56) References Cited

OTHER PUBLICATIONS

Calderbank, A. R. et al., *Nonequiprobable Signaling on the Gaussian Channel*, IEEE Transactions on Information Theory, vol. 36, No. 4, Jul. 1990, pp. 726-740.
Cover, T. M., *Enumerative Source Encoding*, IEEE Transactions on Information Theory, vol. IT-19, Jan. 1973, pp. 73-77.
Fischer, R. et al., *On the Combination of Multilevel Coding and Signal Shaping*, ITG Fachtagung fur Codierung, Quelle, Kanal and Ubertragung, (Aachen), Mar. 1998, pp. 273-278.
Forney, G. D., *Trellis Shaping*, IEEE Transactions on Information Theory, vol. 38, No. 2, Mar. 1992, pp. 281-300.
Huffman, D. A., *A Method for the Constructions of Minimum Redundancy Codes*, in Proceedings of IRE, vol. 40, (1952), pp. 1098-1101.
Huang, W. T. et al., *The Real-Time Compression Layer for Flash Memory in Mobile Multimedia Devices*, Mobile Netw Appl 13 (2008) 547-554.
Kschischang, F. R. et al., *Optimal Nonuniform Signaling for Gaussian Channels*, IEEE Transactions on Information Theory, vol. 39, May 1993, pp. 913-929.
Livingston, J. N., *Shaping Using Variable-Size Regions*, IEEE Transactions on Information Theory, vol. 38, No. 4, Jul. 1992, pp. 1347-1353.
Schalkwijk, J. P. M., *An Algorithm for Source Coding*, IEEE Transactions on Information Theory, vol. IT-18, No. 3, May 1972, pp. 395-399.
Sendrier, N., *Efficient Generation of Binary Words of Given Weight*, Cryptography and Coding, Proceedings of the $5^{th}$ IMA Conference No. 125 LNCS, Springer-Verlag, Dec. 1995, pp. 184-187.
Sendrier, N., *Encoding Information Into Constant Weight Words*, IEEE Conference, ISIT2005, Adelaide, Australia, Sep. 2005, pp. 435-438.

\* cited by examiner

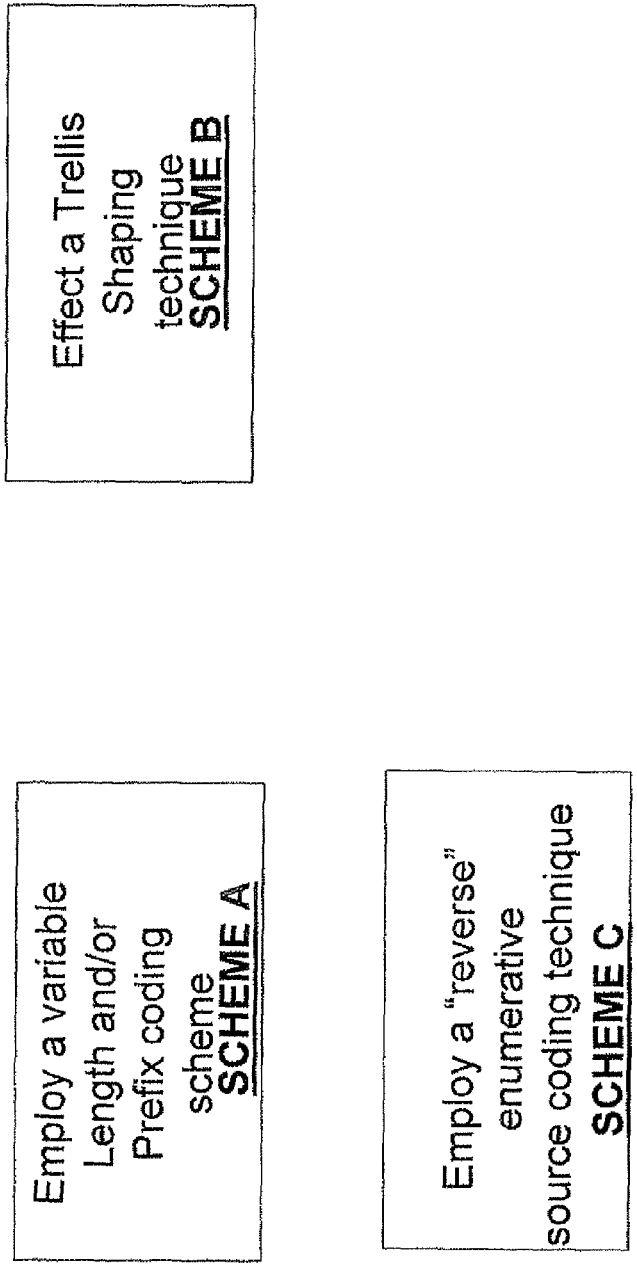

Exemplary Implementation of Step S215

Exemplary Implementation of Step S215

APPARATUS AND METHOD FOR ENHANCING FLASH ENDURANCE BY ENCODING DATA

FIELD AND BACKGROUND OF THE INVENTION

The present invention relates to the storage of data in memory devices such as flash memory devices.

A Discussion of Flash Memory Device Architecture

FIG. 1A is a block diagram of a flash memory storage device 260 (prior art). The flash memory storage device includes a flash memory 270 and a flash controller 280 operative to read data and to write data to the flash memory 270. The terms "program", "programming", "programmed", and "programmable" are used herein interchangeably with the terms "write", "writing", "written", and "writable", respectively, to denote the storing of data in a flash memory.

One example of a flash memory storage device is a "peripheral flash storage device." Peripheral flash storage devices are well-known in the art of computing, in form factors such as USB flash drives (UFD); PC-cards; and small storage cards used with digital cameras, music players, handheld and palm-top computers, and cellular telephones.

FIG. 1B is a block diagram of a peripheral flash memory storage device 260* (the asterisk indicates that the flash memory storage device is a peripheral flash storage device) that is "coupled with" or configured to exchange data with a host device 310 (for example, a laptop or desktop or handheld computers, digital camera, mobile telephone, music player, and video game consoles) via device-side interface 250. Peripheral flash memory storage device 260* and host device 310 communicate with each other via communications link 300 using host-side interface 350 and device-side interface 250 (for example, respective USB or SD interfaces).

In one example, flash memory storage device 260* provides data-reading and data-writing services to host device 310. Data received by flash memory storage device 260* from host device 310 is written to flash memory 270 by flash controller 280. Furthermore, in response to "data read" requests received by flash memory storage, flash controller 280 reads data from flash memory 270.

Errors may be corrected in the read data at "read time" or at any later time. The error-correction may be carried out at least in part by flash controller 280, at least in part by host device 310 (for example, by execution of executable code 340 in RAM 330 by host-side processor 320 or in any other manner), and any other location and in any other manner.

The skilled artisan will appreciate that "peripheral flash storage devices" are not the only class of flash memory storage devices. For example, certain mobile phones, desktop or laptop computers, PDA devices or other electronic devices may also include flash memory and a flash controller, and may not necessarily be configured to couple with a host device and/or provide data reading services and/or data writing service for a host device.

The skilled artisan will appreciate that the flash memory devices described in FIGS. 1A-1B are just one class of peripheral storage memory device, and other memory devices may include other types of volatile memory, such as magnetic memory (for example, magnetoresistive random-access memory (MRAM) or hard disk platters). Furthermore, it is appreciated that the some peripheral storage devices may use volatile memory instead of, or in addition to, flash memory 270.

Flash Memory Endurance

Flash memories have limited endurance to Write/Erase (W/E) cycles. As the number of W/E cycles performed in the Flash increases, the probability of failures increases. These failures are usually related to wearing of the oxide insulation layer due to electrons passing through it during W/E cycles and generating electron trap sites. The failures can be manifested in several ways; such has failure to erase or program a block, or reduced data retention ability of the cells after they exhibited cycling.

In new Flash fabrication processes, as the cell dimensions shrink, the W/E cycling endurance is expected to reduce and become a limiting factor that may affect the commercial viability of the flash memory.

SLC and MLC Flash

Two common forms of non-volatile memory exist. One form is "binary" memory (in the case of flash, single level flash cells or "SLC") in which data is represented as one single binary bit per memory cell, the bit normally representing a binary "1" or "0".

Another form is multi-level cell (MLC) memory in which one cell is used to store more than one binary bit.

Binary memory cells store charge on a floating gate of a floating gate transistor where different charge distributions (or, equivalently, different threshold voltage distributions) correspond to the two different stored bit configurations. FIG. 1C. is a charge plot illustrating charge distributions for the two states of such a binary non-volatile ('NVM') cell. These two configurations or states are illustrated as a "1" (erased) and a "0" (programmed). Note that this is only a convention and a "1" could instead represent a programmed bit and a "0" could likewise represent an erased bit. Accordingly, the 1=erased, 0=programmed convention will be used herein throughout. These two states are the two possible "cell states" of a SLC cell.

MLC memory cells likewise store charge on a floating gate of a floating gate transistor where different charge distributions correspond to different stored bit configurations. For example, in a two-level MLC Flash memory two bits are stored in the cell and the two bits are referred to as an upper page bit (upage) and a lower page bit (lpage). Four charge distributions (or, equivalently, four threshold voltage distributions) represent the four possible states of the upper and lower page bits. FIG. 1D is a charge plot illustrating charge distributions for the various states of a 2-bit MLC NVM cell. In FIG. 1D, the four charge distributions are illustrated as a "11", "10", "00" and "01". The "11" state is called the "erased" state. The remaining states are "programmed" states. All four states collectively are the "cell states" of a 2-bit MLC cell. (As discussed above with respect to binary memories, this is only a convention. If desired, the bit to state mapping may be interchanged).

Initially the cell is in the erased state. When the bits are programmed, the distribution is moved from the erased state on the left of FIGS. 1C and 1D to a programmed state on the right. Physically this corresponds to charge being stored on the floating gate. This is normally accomplished using a hot electron injection mechanism or a tunneling mechanism to force channel electrons across an, insulator onto the floating gate. Cell erasure is normally achieved through a tunneling mechanism to remove electrons from the floating gate. The transition of a cell from the erased state to a programmed state and back to the erased state is called a "write/erase cycle". Each write/erase cycle causes "wear" on the cell and once a cell has accumulated enough wear, it may experience a failure mode. A cell already in the erased state experiences little or no wear when repeatedly erased.

From another point of view, FIGS. 1C and 1D illustrate two different mappings of bit patterns to cell states. The mapping in FIG. 1C is

| BIT PATTERN | CELL STATE |
|---|---|
| 1 | 1 |
| 0 | 2 |

The mapping in FIG. 1D is

| BIT PATTERN | CELL STATE |
|---|---|
| 11 | 1 |
| 10 | 2 |
| 00 | 3 |
| 01 | 4 |

In flash memories, higher cell states correspond to higher threshold voltages.

It would be desirable to further improve the longevity and reliability of SLC and/or MLC memory cells.

DEFINITIONS

The shaping encodings introduced below map input (information) bit strings to transformed bit strings. The mapping is one-to-one and onto: every bit string gets mapped into a unique transformed bit string. If there are K bits per input string then there are $2^K$ different possible input strings and $2^K$ different transformed strings. If a sufficiently large number of flash cells are programmed to store all $2^K$ input strings ($2^K$K SLC cells, $2^{K-1}$K two-bit MLC cells, etc.) according to the relevant mapping of bit patterns to cell states, then all the cell states are equally occupied.

For example, if K=4 there are $2^4$=16 possible strings:
0000, 0001, 0010, 0011, 0100, 0101, 0110, 0111,
1000, 1001, 1010, 1011, 1100, 1101, 1110, 1111
for a total of $2^4 \times 4$=64 bits so 64 SLC cells are needed to store all 16 possible strings. Half the cells are in cell state 1 of FIG. 1C, and half the cells are in cell state 2 of FIG. 1C, so both cell states are equally occupied.

Alternatively, 32 ($2^3 \times 4$) four-level MLC cells are needed to store all 16 possible strings. One-quarter of the cells are in cell state 1 of FIG. 1D, one-quarter of the cells are in cell state 2 of FIG. 1D, one-quarter of the cells are in cell state 3 of FIG. 1D and one-quarter of the cells are in cell state 4 of FIG. 1D, so all four cell states are equally occupied.

That an encoding has a downward bias with respect to the mapping of bit patterns to cell states means that if a sufficiently large number of cells are programmed to store the full set of all $2^K$ transformed strings simultaneously (possibly using more cells than would be needed to store all of the $2^K$ possible different input strings, as in the case of the shaping encodings discussed below) then the highest cell state is occupied less than at least one other cell state. That an encoding has an "asymptotic" downward bias means that the encoding has a downward bias in the limit of large K. That an encoding has a bias towards the lower half of the cell states means that if a sufficiently large number of cells are programmed to store all $2^K$ transformed strings then the upper half of the cell states are occupied less than the lower half of the cell states. Note that in the case of SLC cells, a "downward bias" and a "bias towards the lower half of the cell states" are identical. In the case of two-bit MLC cells, a "bias towards the lower half of the cell states" means that if a sufficiently large number of cells are programmed to store all $2^K$ transformed strings then cell states 3 and 4 are occupied less than cell states 1 and 2.

The mappings of bit patterns to cell states in FIGS. 1C and 1D both have an even number of cell states. Mappings of bit patterns to cell states with odd numbers of cell states also are known. If the number of cell states is odd, then the middle state is excluded from the count of cell states. For example, if there are three cell states, then that the encoding has a bias towards the lower half of the cell states means that if a sufficiently large number of cells are programmed to store all $2^K$ transformed strings then the uppermost cell state is occupied less than the lowermost cell state.

Transformations, such as the scrambling transformation mentioned briefly below, that randomize the input data, just transform a collection of all possible $2^K$ input strings into the same collection in a different order, and so are not biased downwards. It has been proposed to accomplish the purpose of the shaping encodings described below, at least in the case of SLC flash cells, by flipping the bits of input strings that have more 0's than 1's. This transformation is biased downward for small values of K, but is asymptotically unbiased.

The shaping encoding transformations discussed below all are biased asymptotically downwards.

SUMMARY OF THE INVENTION

One embodiment provided herein is a method of storing a first plurality of input bits in a plurality of memory cells, including: (a) providing a first mapping of bit patterns to cell states of the memory cells; (b) mapping the first plurality of input bits to a first plurality of transformed bits that is larger in number than the first plurality of input bits, using a first shaping encoding that has a downward asymptotic bias with respect to the first mapping of bit patterns to cell states; (c) programming at least a portion of the first sub-plurality of the memory cells to store the first plurality of transformed bits according to the first mapping of bit patterns to cell states; and (d) erasing the at least portion of the first sub-plurality of the memory cells before programming the at least portion of the first sub-plurality of the memory cells to store any other bits.

Another embodiment provided herein is a memory controller, for a memory that includes a plurality of memory cells, that is operative: (a) to provide a mapping of bit patterns to cell states of the memory cells; (b) to store a plurality of bits in the memory cells, by: (i) mapping the plurality of input bits to a plurality of transformed bits that is larger in number than the plurality of input bits, using a shaping encoding that has a downward asymptotic bias with respect to the mapping of bit patterns to cell states, and (ii) programming at least a portion of the memory cells to store the plurality of transformed bits according to the mapping of bit patterns to cell states; and (c) to erase the at least portion of the plurality of memory cells before programming the at least portion of the plurality of memory cells to store any other bits.

Another embodiment provided herein is a system for storing a plurality of input bits, including: (a) a first memory including a plurality of memory cells; and (b) a host, of the first memory, including: (i) a second memory for storing code for managing the first memory by: (A) providing a mapping of bit patterns to cell states of the memory cells, (B) mapping the plurality of input bits to a plurality of transformed bits that is larger in number than the plurality of input bits, using a shaping encoding that has a downward asymptotic bias with respect to the mapping of bit patterns to cell states, (C) programming at least a portion of the memory cells to store the transformed bits according to the mapping of bit patterns to cell states, and (D) erasing the at least portion of the plurality of memory cells before programming the at least portion of memory cells to store any other bits, and (ii) a processor for executing the code.

Another embodiment provided herein is a computer-readable storage medium having embedded thereon computer-readable code for storing a plurality of input bits in a memory that includes plurality of memory cells, the computer-readable code including: (a) program code for mapping the plurality of input bits to a plurality of transformed bits that is larger in number than the plurality of input bits, using a shaping encoding that has a downward asymptotic bias with respect to a mapping of bit patterns to cell states; (b) program code for programming at least a portion of the memory cells to store the transformed bits according to the mapping of bit patterns to cell states; and (c) program code for erasing the at least portion of the plurality of memory cells before programming the at least portion of memory cells to store any other bits.

According to a basic method of storing a first plurality of input bits in a plurality of memory cells, a first mapping of bit patterns to cell states of the memory cells is provided. A first shaping encoding is used to map the first plurality of input bits to a first plurality of transformed bits that is larger than the first plurality of input bits. The first shaping encoding has a downward asymptotic bias with respect to the first mapping of bit patterns to cell states. At least a portion of the first sub-plurality of the memory cells is programmed to store the first plurality of transformed bits according to the first mapping of bit patterns to cell states. The at least portion of the first sub-plurality of memory cells is erased before the at least portion of the first sub-plurality of memory cells is again programmed to store any other bits.

Note that it is not necessary for all possible input bit pluralities to be mapped to larger transformed bit pluralities by the first shaping encoding, as long as the first shaping encoding is such that at least some input bit pluralities are mapped to larger transformed bit pluralities.

Preferably, the first shaping encoding has a downward asymptotic bias towards a lower half of the cell states.

Preferably, the first shaping encoding is non-linear, for example a variable length encoding, or a reverse enumerative source encoding. Alternatively, the first shaping encoding is a trellis shaping encoding. Most preferably, if the first shaping encoding is a variable length encoding then the first shaping encoding is a prefix encoding such as a reverse Huffman encoding.

Preferably, before the first plurality of input bits is mapped to the first plurality of transformed bits, a maximum number of the memory cells of the first sub-plurality needed to store the first plurality of transformed bits is estimated, and that number of memory cells of the first sub-plurality is reserved for storing the first plurality of transformed bits. If it turns out that the estimated maximum number of the memory cells is too low, then either the first plurality of input bits itself, rather than the first plurality of transformed bits, is stored in at least a portion of the first sub-plurality of memory cells, or the first plurality of input bits is scrambled to provide a plurality of scrambled bits. In the latter case, the scrambling is followed by using the first shaping encoding to map the scrambled bits to a plurality of transformed scrambled bits.

Preferably, the first shaping encoding is selected in accordance with a desired shaping scheme of the first sub-plurality of the memory cells. Note that different shaping schemes may have the same downward bias.

Preferably, a second mapping of bit patterns to cell states of the memory cells is provided. A second shaping encoding that is different from the first shaping encoding is used to map a second plurality of input bits to a second plurality of transformed bits. Note that the second shaping encoding could be an identity mapping, in which case the second plurality of transformed bits is identical to the second plurality of input bits. At least a portion of a second sub-plurality of the memory cells is programmed to store the second plurality of transformed bits according to the second mapping of bit patterns to cell states. The first and second mappings of bit patterns to cell states may be either identical or different. For example, if the first mapping of bit patterns to cell states is used for caching input data that later will be copied to long-term storage then the two mappings normally are different.

Usually, the second shaping encoding has a downward asymptotic bias with respect to the cell states of the second mapping of bit patterns to cell states.

Most preferably, the first and second shaping encodings are selected in accordance with respective properties of the first and second sub-pluralities of the memory cells. Exemplary respective properties include respective numbers of programming cycles endured by the first and second sub-pluralities of the memory cells.

Preferably, the method also includes reading at least a portion of the first sub-plurality of memory cells, thereby obtaining a recovered first plurality of transformed bits. The recovered first plurality of transformed bits is decoded relative to the first shaping encoding, whereby a recovered first plurality of input bits is obtained. At least a portion of a second sub-plurality of the memory cells then is programmed to store the recovered first plurality of input bits.

More preferably, the method also includes systematic error-correction-encoding of the first plurality of transformed bits, thereby providing one or more redundancy bits. At least a portion of a second sub-plurality of the memory cells is programmed to store the redundancy bit(s). Then, most preferably, the at least portion of the first sub-plurality of the memory cells is read, whereby a recovered first plurality of transformed bits is obtained, and the at least portion of the second sub-plurality of the memory cells is read, whereby one or more recovered redundancy bits is/are obtained. The recovered first plurality of transformed bits is systematic error-correction-decoded according to the recovered redundancy bit(s). The systematic error-correction-decoding is based at least in part on the first shaping encoding.

Alternatively, the first shaping encoding includes non-systematic error-correction-encoding. Then, most preferably, the at least portion of the first sub-plurality of the memory cells is read, whereby a recovered first plurality of transformed bits is obtained. The recovered first plurality of transformed bits is non-systematic error-correction-decoded relative to the first shaping encoding.

Preferably, the number of transformed bits is at most about 1.29 times the number of input bits.

Preferably, the downward asymptotic bias exceeds 75%.

The scope of the appended claims includes a memory controller that uses the basic method to control a memory that includes a plurality of memory cells, and a memory device that includes such a controller and such a memory.

The scope of the appended claims also includes a system for storing a plurality of bits. The system includes a first memory that includes a plurality of memory cells and a host of the first memory. The host includes a second memory for storing code for implementing the basic method and a processor for executing the code. The scope of the appended claims also includes a computer-readable storage medium having embedded thereon computer-readable code for implementing the basic invention.

BRIEF DESCRIPTION OF THE DRAWINGS

Various embodiments are herein described, by way of example only, with reference to the accompanying drawings, wherein:

FIG. 3 shows several alternative classes of shaping encodings;

DESCRIPTION OF THE PREFERRED EMBODIMENTS

Figure 1A:
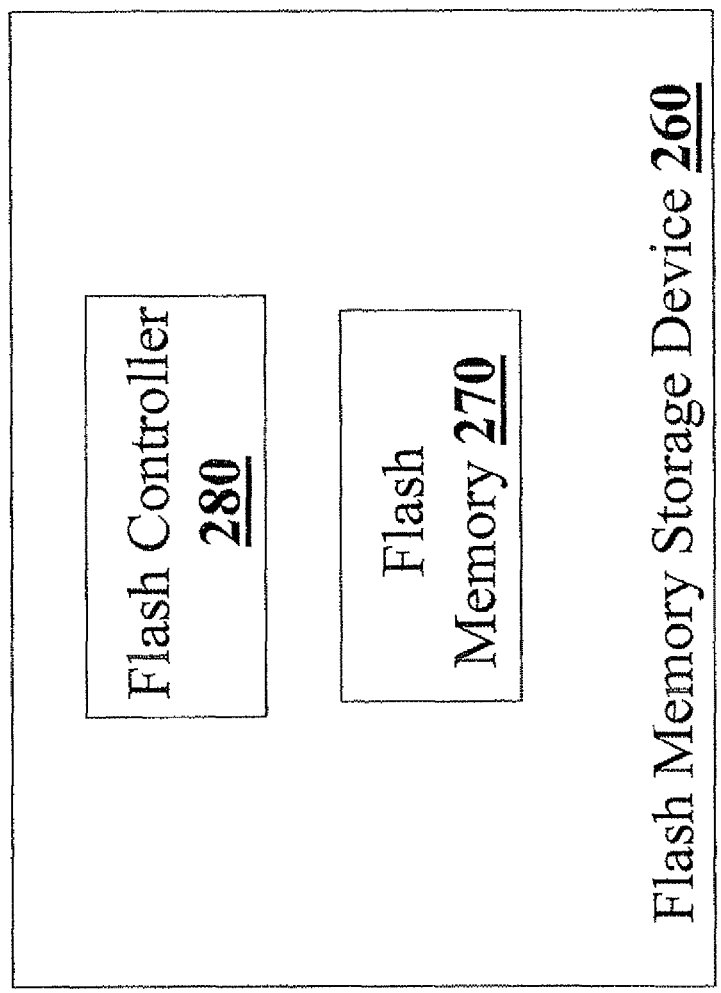
FIG. 1A is a block diagram of a flash memory storage device.

The principles and operation of a memory device such as a flash memory device according to the present invention may be better understood with reference to the drawings and the accompanying description.

The claims below will be better understood by referring to the present detailed description of example embodiments with reference to the Figures. The description, embodiments and Figures are not to be taken as limiting the scope of the claims. It should be understood that not every feature of the presently disclosed methods and apparatuses is necessary in every implementation. It should also be understood that throughout this disclosure, where a process or method is shown or described, the steps of the method may be performed in any order or simultaneously, unless it is clear from the context that one step depends on another being performed first. As used throughout this application, the word "may" is used in a permissive sense (i.e., meaning "having the potential to'), rather than the mandatory sense (i.e. meaning "must").

Some embodiments relate to a device and apparatus where flash cells are programmed in a manner that results in reduced cell wearing and hence increased endurance to W/E cycles (i.e. more W/E cycles can be performed before failures are observed). Towards this end, an apparatus and method that employ one or more coding schemes are provided. The coding schemes are based on the observation that cell wearing is proportional to the amount of charge passed through the cell's oxide insulation layer and into its floating gate. i.e. when a cell is programmed to high Vth, the cell is worn more than when the cell is programmed to lower Vth.

Thus, in some embodiments, sequences of information bits intended for storage are first mapped into sequences of programming levels (i.e., cell states) which are expected to induce less cell wearing. e.g. in the case of a single-bit-per-cell Flash, where two Vth levels are represented in each cell—Low ("1") and High ("0"), then sequences of information bits are mapped into a coded sequence of bits in which the expected fraction of "0"'s is minimized.

There may be a "cost" when these information bit sequences are mapped before storage—i.e. inducing a non-uniform distribution over the programming levels (e.g. in single-bit-per-cell Flash programming more "1"'s than "0"'s) may require allocating some "overhead," which allows one to store less information in a given number of cells. Thus, in some embodiments, flash "capacity" is "sacrificed" in order to provide elevated endurance. Furthermore, various techniques and apparatuses described herein employ "efficient schemes" that require a "minimal overhead" for a given increase in endurance (or conversely, that provide a "maximum endurance increase").

The methods and apparatuses described herein for endurance enhancement can also be used for mitigating certain data dependent noises that arise during programming of flash cells and corrupt the stored data. Examples of such noises are various disturbance effects on a flash cell, during its programming or during programming of its neighboring cells, that cause unintentional or inaccurate programming of the cell. These noises depend on the data pattern that is programmed to the cell and its neighbors. For example, a cell that is intended to be in the erase state may experience unintentional programming if its neighboring cells are programmed to a high state.

The probability of such unintentional programming (usually referred to as "Program Disturb") increases if neighboring cells are programmed to high states. The more neighbors programmed to a high state and the higher the state of the neighboring cells, the higher the probability of program disturb occurring. Hence, it may be desirable to reduce the probability for programming cells to high states, as this reduces the probability of various disturbance effects. In turn, this increases the reliability of the stored data and may alleviate the error correction code requirements. If the reduction in error correction code overhead is higher than the overhead required by the techniques described herein for inducing non-uniform distributions over the programmed states, then the overall flash cost is reduced as less overhead is required. Hence, the methods and apparatuses described herein can be applied both for endurance enhancement by inducing less cell wearing during programming and for mitigation of various data dependent noises.

Figure 2:
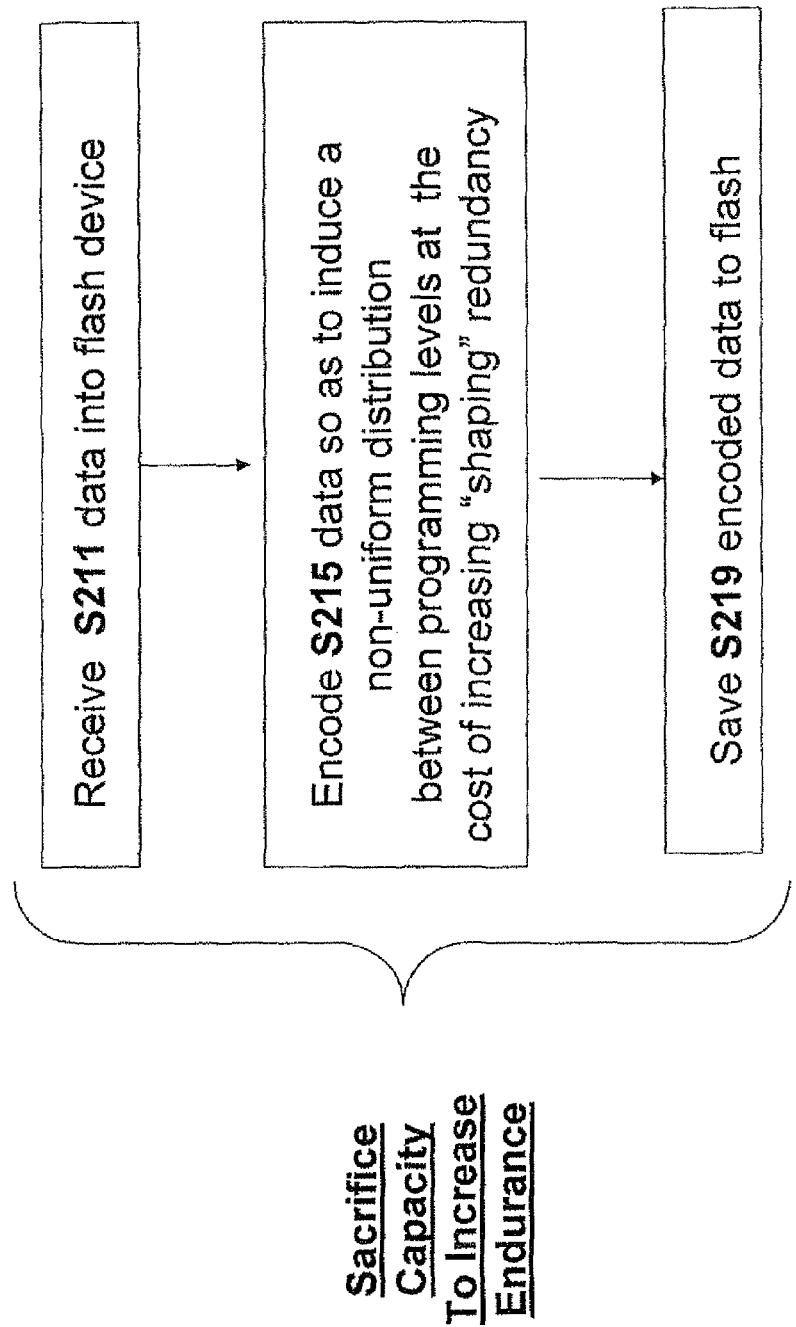
FIG. 2 is a high level flow chart of a shaping encoding routine.

FIG. 2 is a flow chart of an exemplary routine for increasing endurance of a flash memory device using a coding technique which sacrifices flash memory capacity in order to provide an improved effective endurance and/or in order to mitigate data-dependent noises. In particular, a coding technique which maps a binary number/word of length K into a longer binary number/word of length N (N>K) may be used.

In step S211, data is received into flash device 260 (for example, via device-side interface 250). It is noted that, on average (i.e. when megabytes or more of data are received), the data received into the flash device would, when programmed to flash cells of the flash device, cause the flash cells to have a substantially "uniform" distribution among programming levels—i.e. for SLC cells, approximately 50% of the cells would be programmed to a "0" state and approximately 50% of the cells would be programmed to a "1" state, for MLC cells with 2 levels, approximately 25% of the cells would be programmed to a "00" state, approximately 25% of the cells would be programmed to a "10" state, approximately 25% of the cells would be programmed to a "01" state, and approximately 25% of the cells would be programmed to a "11" state, and so on.

In step S215, "input" data is encoded to produce "encoded" data which when programmed to the flash memory cells would induce a more 'non-uniform distribution' between programming states than if the input data were directly encoded to flash. Thus, in step S215 the data is "shaped" to introduce the non-uniform distribution and to reduce the entropy (at the cost of "shaping-induced" redundancy) of the distribution between programming states.

Two types of "data redundancy" are discussed herein—redundancy due to addition of bits for error correction ("ECC data redundancy") and redundancy due to the cost of shaping of the distribution of programming states and the reduction of entropy ("data shaping redundancy").

The "data shaping redundancy" causes non-volatile memory (e.g. flash) capacity to be sacrificed in order to increase endurance and/or in order to mitigate data-dependent noises.

In step S219, the encoded data is saved to flash.

Figure 6:
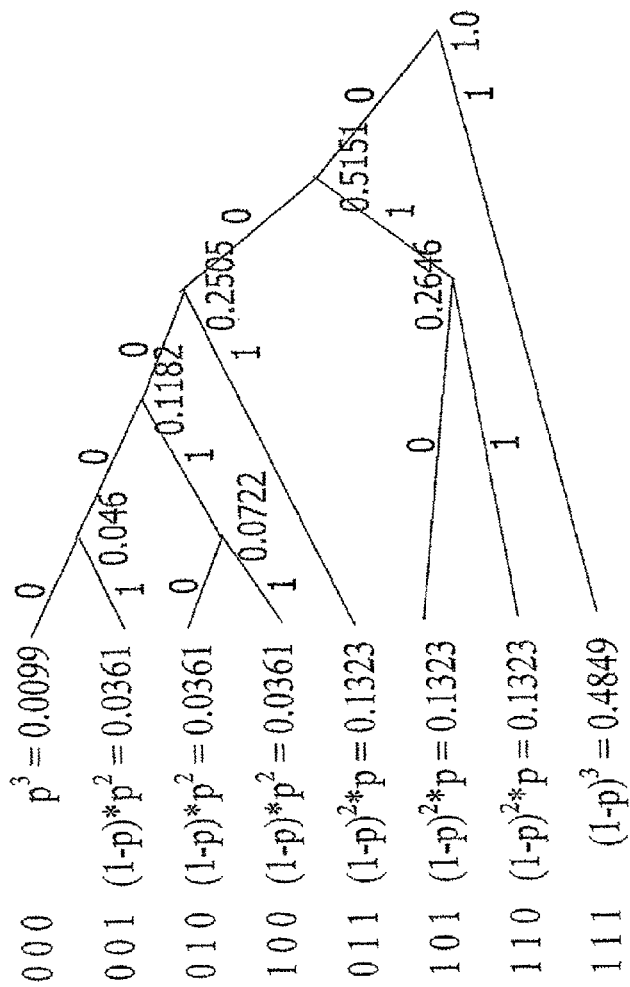
FIG. 6 shows a prefix code construction, based on three-bit coded sequences, that is designed to induce a zero fraction of 0.2145 in the encoded sequence.

Normally, as shown in FIG. 2, the sequences of information bits are mapped into sequences of cell states indirectly, by encoding the information bit sequences as encoded sequences that are programmed to the flash memory. In the appended claims, the information bit sequences are called "pluralities of information bits" and the encoded sequences are called "pluralities of transformed bits". Alternatively, the sequences of information bits can be mapped directly into sequences of programming levels. FIG. 6 below illustrates one such direct mapping, for a three-bit (eight level) MLC flash cell.

As illustrated in FIG. 3, various schemes for encoding data may be used in step S215—some schemes may be more efficient (i.e. in terms of required 'overhead' of sacrificed flash capacity in order to provide an efficiency) than others.

In some embodiments ("scheme A"), a presently-disclosed variable length and/or prefix coding scheme and/or "reverse Huffman" scheme may be used to induce the non-uniform distribution between programming states (see the section below entitled "reverse Huffman" scheme).

Alternatively or additionally, a trellis shaping technique ("scheme B") may be effected in order to encode input data in a manner which increases flash efficiency by inducing a non-uniform distribution between states in the programmed flash cells.

Alternatively or additionally, a "reverse enumerative source coding scheme ("scheme C") technique" may be employed in order to encode input data in a manner which increases flash efficiency by inducing a non-uniform distribution between states in the programmed flash cells.

Alternatively or additionally, one or more schemes used for reducing program disturb upon flash cell programming may be used to induce the non-uniform distribution between states in the programmed flash cells—for example, see US 2008/0158948 entitled "Avoiding errors in a flash memory by using substitution transformations" and/or US 2008/0031042 entitled "Methods of avoiding errors in flash memory", each of which is incorporated by reference in its entirety.

A Discussion of Strategies for Encoding Data

A relatively "efficient" scheme for encoding input data based upon "reverse Huffman encoding" ("scheme A") is presented herein—i.e. a scheme which, on average, provides a "good" increase in endurance with a "minimal" cost of data redundancy/flash capacity sacrificed.

The scheme will be discussed for the specific case of single-bit-per-cell flash memory cells (single level cells or SLC cells). Nevertheless, it is appreciated that the scheme and related schemes may be applied to multi-level flash cells (MLCs).

In a single-bit-per-cell Flash memory endurance enhancement can be achieved by minimizing the number of cells that are programmed to high state ("0") and maximize the number of cells that are left erased—i.e. programmed to the low state ("1"). Hence, we would like to map sequences of information bits into coded sequences in which the expected fraction of "0"s is minimized.

In some embodiments, presently-disclosed schemes provide one or more of: (i) a relatively "good" efficiency in terms of the required overhead for inducing a desired expected fraction of "0"s (or "1"s) and/or (ii) the implementation complexity of its encoding and decoding procedures.

Before describing the one or more proposed schemes, a discussion relating to the theoretical limit of efficiency is provided.

Let's assume that we want to induce a probability distribution $P=[p_1, p_2, \ldots, p_m]$ over the cell states of a cell, where $m=2^{BPC}$ is the number of states (or voltage levels) programmed in the cell and BPC is the number of bits per cell. Then in order to induce such probability distribution P we will need to allocate at least redundancy r (or use code rate R=1−r) which satisfies the following equation:

$$r = 1 - H(P)/BPC,$$

where $H$ is the entropy function $H(P) = -\sum_{i=1}^{m} p_i \log 2(p_i)$.

Discussion Relating to a Theoretical Limit of Efficiency

Not desiring to be bound by any particular theory, a discussion relating to a theoretical limit of "efficiency/redundancy" tradeoff is now presented. Assume that we map sequences of K information bits into codewords of length N, where N>K. Then the overhead of the scheme is M=N−K. What is the lowest expected fraction p of "0"'s that can be achieved by this scheme? Obviously, the best we can do is to generate a codebook composed of the $2^K$ length N binary sequences having the smallest number of "0"'s. So, we take the single all "1"'s sequence and then all $$\binom{N}{1} \text{ length } N$$

sequences with a single "0", then all $$\binom{N}{2} \text{ length } N$$

sequences with two "0"'s and so on, until we accumulate $2^K$ codewords. Hence, the expected fraction of "0"'s in a codeword of this code is related to its overhead as follows:

For sake of simplicity, assume that K and N are determined in such a way that the codebook can be constructed from all the binary sequences with up to $w_{max}$ "0"'s, i.e.

$$2^K = \sum_{w=0}^{w_{MAX}} \binom{N}{w}.$$

Then the expected fraction of "0"'s is given by $$p = \sum_{w=0}^{w_{MAX}} \frac{\binom{N}{w}}{2^K} \cdot w.$$

It can be shown that for a given ratio R=K/N (called the code rate), the fraction of "0"'s p will decrease as the code length N tends to infinity. For example, consider a simple scheme, which maps sequences of K=2 bits into codewords of length N=3 bits, (i.e. code rate is R=⅔). Since this is a very short code, this mapping can be implemented using the following simple table:

TABLE 1A

| INFORMATION | CODE |
|---|---|
| 00 | 011 |
| 01 | 101 |
| 10 | 110 |
| 11 | 111 |

In this case, $$p = \frac{1}{4} \cdot \left(0 + \frac{1}{3} + \frac{1}{3} + \frac{1}{3}\right) = \frac{1}{4}.$$

However, if we use a longer code we can do better and achieve lower p that will result in smaller wearing of the cells and increased endurance, for the same code rate R.

The code of Table 1A originally was introduced in the context of write-once memories, to enable a write-once memory to be written twice. The following table shows the code used in the second writing:

TABLE 1B

| | CODE IN FIRST WRITING | | | |
|---|---|---|---|---|
| INFORMATION | 011 | 101 | 110 | 111 |
| 00 | 011 | 100 | 100 | 100 |
| 01 | 010 | 101 | 010 | 010 |
| 10 | 001 | 001 | 110 | 001 |
| 11 | 000 | 000 | 000 | 111 |

The second writing, of course, has a greater value of p than the first writing. The second writing has p=3/48=5/8. This write-twice scheme also may be used to write twice to the same cells of a flash memory before erasing the cells.

The relative overhead (N/K) of the code of tables 1A and 1B is 50% (three SLC cells used to store two information bits). It can be shown that the theoretical minimum relative overhead of a "write twice" scheme is about 29.38%.

In the case of SLC cells, a transformation with a zero fraction p has a downward bias of 100(1−p) %. For example, the transformation of Table 1A puts ¼ of the cells in their upper cell states and ¾ of the cells in their lower cell states and so has a downward bias of 75%.

It can be shown that as the code length N tends to infinity we get the following relation:

$$2^K = \sum_{w=0}^{w_{MAX}} \binom{N}{w} \cong 2^{N \cdot H\left(\frac{w_{MAX}}{N}\right)} = 2^{N \cdot H(p)}$$

where $H(x) = -x * \log_2(x) - (1-x) * \log_2(1-x)$.

Hence, the minimal expected fraction p of "0"'s that can be achieved by a coding scheme of rate R=K/N and large N is given by:

$$p \cong H^{-1}\left(\frac{K}{N}\right) = H^{-1}(R).$$

Figure 4A:
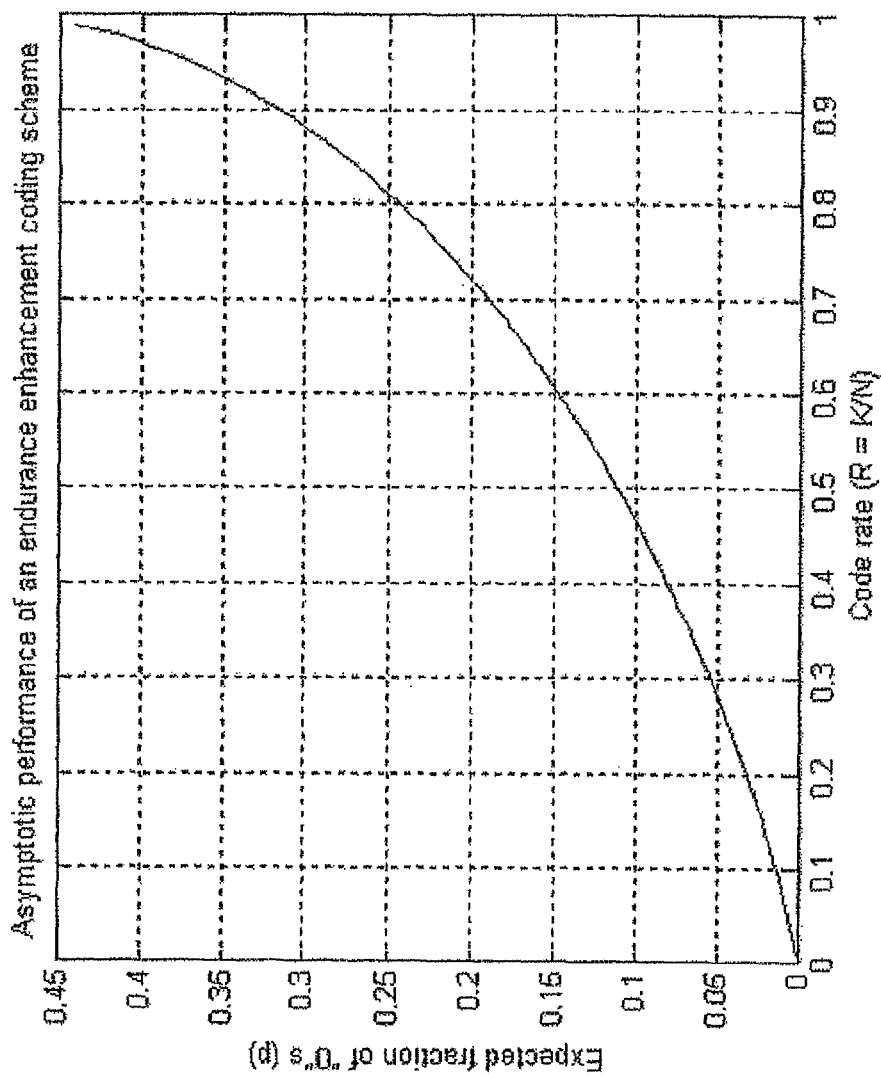
FIG. 4A is a plot of achievable zero fraction vs. code rate.

For sake of comparison, in the case of R=⅔, if we use a long code we can get p=0.174, compared to p=0.25 that we got with the short code (N=3). FIG. 4A shows the achievable p as a function of the code rate R, for an optimal scheme based on a long code.

What is the endurance enhancement gain that we can get as a function of the fraction of "0"'s p? Exact gain depends on the specific Flash device and process. However, assuming a simple model where the gain is roughly linear with 1/p (i.e. if the fraction of programmed cells falls by a factor of 2, so does the wearing), we get the following gain compared to a prior art scheme in which p=½.

$$\text{Gain} = \frac{1/2}{p} = \frac{1}{2H^{-1}(R)}.$$

If we compute the endurance gain under the simple model in the case of code rate R=⅔ we get the following results: for the simple scheme based on a short code (N=3) we get a gain of $$\frac{1}{2 \cdot 0.25} = 2,$$

while for an optimal scheme based on a long code we can get a gain of $$\frac{1}{2 \cdot 0.174} = 2.874.$$

Figure 4B:
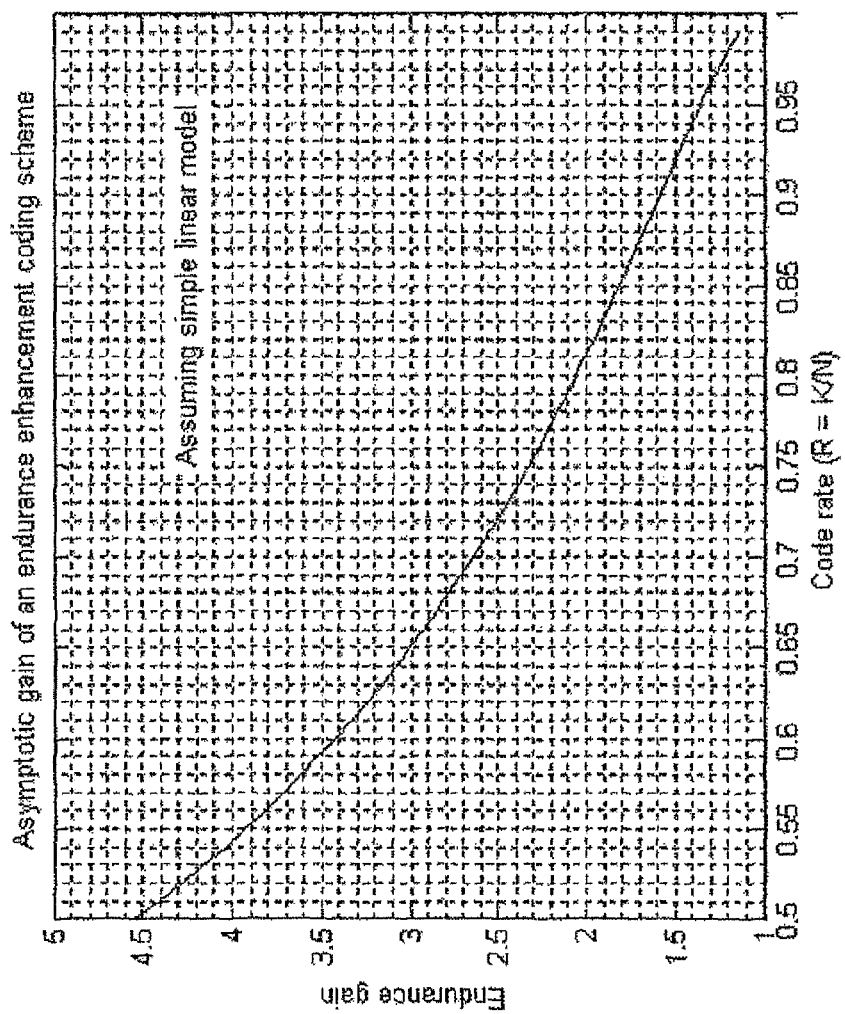
FIG. 4B is a plot of achievable endurance gain vs. code rate.

The achievable endurance enhancement gain under the simple model is shown in FIG. 4B.

The analysis above shows that using long codes is beneficial. Unfortunately, in this case using a simple look up table similar to the way it was done in the short code example is prohibitive, both in terms of memory size and in terms of the encoding and decoding complexity. Hence, a more sophisticated scheme is required. Next, we propose several schemes for implementing a long code.

Scheme C: Employing a "Reverse Enumerative Source Coding Technique"

In some embodiments, it is possible to adopt one or more techniques known in the field of communications for source coding, where a binary source which outputs a binary sequence in which "0"'s appear with probability p is compressed into a binary sequence in which "0"'s appear with probability ½. According to this option (OPTION C), we can use such methods, but in the opposite direction. We start with a compressed source of information (with probability ½ for "0"'s) and we then decompress it into a binary sequence with probability p<½ for "0"'s. Various methods are known for source coding. Some references are (all documents are incorporated by reference in their entirety) are:

1) T. M. Cover, "Enumerative Source Encoding," IEEE Transactions on Information Theory, vol. IT-19, pp. 73-77, January 1973.

2) J. P. M. Schalkwijk, "An Algorithm for Source Coding," IEEE Transactions on Information Theory, vol. IT-18, pp. 395-399, May. 1972.

3) N. Sendrier. "Efficient generation of binary words of given weight" in Colin Boyd, editor, Cryptography and Coding; proceedings of the 5th IMA conference, number 1025 in LNCS, pages 184-187. Springer-Verlag, December 1995.

4) N. Sendrier. "Encoding information into constant weight words" in IEEE Conference, ISIT'2005, pages 435-438, Adelaide, Australia, September 2005.

Scheme B: Trellis Shaping Techniques

Another option is to adopt methods known in the field of communication for constellation shaping. These methods map binary information sequences into signal constellations, such that non-uniform probability is induced over the signal set. Such methods can be adopted for the problem at hand. E.g. in the case of a single-bit-per-cell Flash memory, we map back the signal points into binary sequences with unequal probability p for "0" and "1", by assigning to each signal point a binary sequence. Some references (all documents are incorporated by reference in their entirety) are:

1) A. R. Calderbank, L. H. Ozarow, "Nonequiprobable Signaling on the Gaussian Channel", IEEE Transactions on Information Theory, vol. 36, pp. 726-740, July 1990.

2) G. D. Forney, "Trellis Shaping", IEEE Transactions on Information Theory, vol. 38, pp. 281-300, March 1992.

3) F. R. Kschischang, S. Pasupathy, "Optimal Nonuniform Signaling for Gaussian Channels", IEEE Transactions on Information Theory, vol. 39, pp. 913-929, May 1993.

4) J. N. Livingston, "Shaping Using Variable-Size Regions", IEEE Transactions on Information Theory, vol, 38, pp. 1347-1353, July 1992.

5) R. Fischer, J. Huber, U. Wachsmann, "On the Combination of Multilevel Coding and Signal Shaping", ITG Fachtagung fur Codierung, Quelle, Kanal and Ubertragung, (Aachen), pp. 273-278, March 1998.

Scheme A: Reverse Huffman Techniques

A First Discussion

Next we describe in detail a preferred embodiment of an encoding method for enhancing flash memory endurance. This embodiment is based on a variable length coding scheme. Such an approach is not common in communication applications where the variable length code poses practical problems. However, for the problem of endurance enhancement in flash, we propose a probabilistic solution for dealing with the variable code length. The solution we obtain is very efficient, as will be shown, both in terms of the achievable gain for a given overhead and in terms of implementation complexity. According to this embodiment, the endurance enhancement code is implemented using a variable length code which maps variable length information sequences into fixed length coded sequences.

In some embodiments, the variable length code is a prefix code, such that no sequence of information bits is a prefix of another sequence of information bits. This simplifies the encoding and decoding procedures that can be done using a binary tree search.

It has been found that usage of a Huffman prefix code [D. H. Huffman, "A method for the construction of minimum redundancy codes," in Proceedings of IRE, vol. 40, pp. 1098-1101, 1952] can provide optimal tradeoff between overhead and endurance gain, as will be shown. One example of such a scheme is shown is a code map $CM_{RH}$ (RH is an abbreviation for 'reverse Huffman') of size s (in this non-limiting example, s=8) where predefined source sequences SS are mapped into target sequences TS—i.e., each source sequence $SS_i$ is mapped to a respective target sequence $TS_i$, i.e. $CM = \{SS_1 \rightarrow TS_1, SS_2 \rightarrow TS_2 \ldots SS_S \rightarrow TS_S\}$ is below:

TABLE 2

| | | | |
|---|---|---|---|
| $S_1 = 1$ | $TS_1 = 111$ | size($SS_1$) = 1 | size($TS_1$) = 3 |
| $SS_2 = 011$ | $TS_2 = 110$ | size($SS_2$) = 3 | size($TS_2$) = 3 |
| $SS_3 = 010$ | $TS_3 = 101$ | size($SS_3$) = 3 | size($TS_3$) = 3 |
| $SS_4 = 001$ | $TS_4 = 011$ | size($SS_4$) = 3 | size($TS_4$) = 3 |
| $SS_5 = 00011$ | $TS_5 = 100$ | size($SS_5$) = 5 | size($TS_5$) = 3 |
| $SS_6 = 00010$ | $TS_6 = 010$ | size($SS_6$) = 5 | size($TS_6$) = 3 |
| $SS_7 = 00001$ | $TS_7 = 001$ | size($SS_7$) = 5 | size($TS_7$) = 3 |
| $SS_8 = 00000$ | $TS_8 = 000$ | size($SS_8$) = 5 | size($TS_8$) = 3 |

Below, this "reverse Huffman" code map will be derived in accordance with "Huffman techniques" and tied to a specific example.

For the non-limiting codemap $CM_{RH}$, variable length "source sequences" of information bits whose length ranges between one bit (i.e. for $SS_1$) and five bits (e.g. for $SS_5$) are mapped into length three-bit "target" sequences of coded bits.

Figure 5:
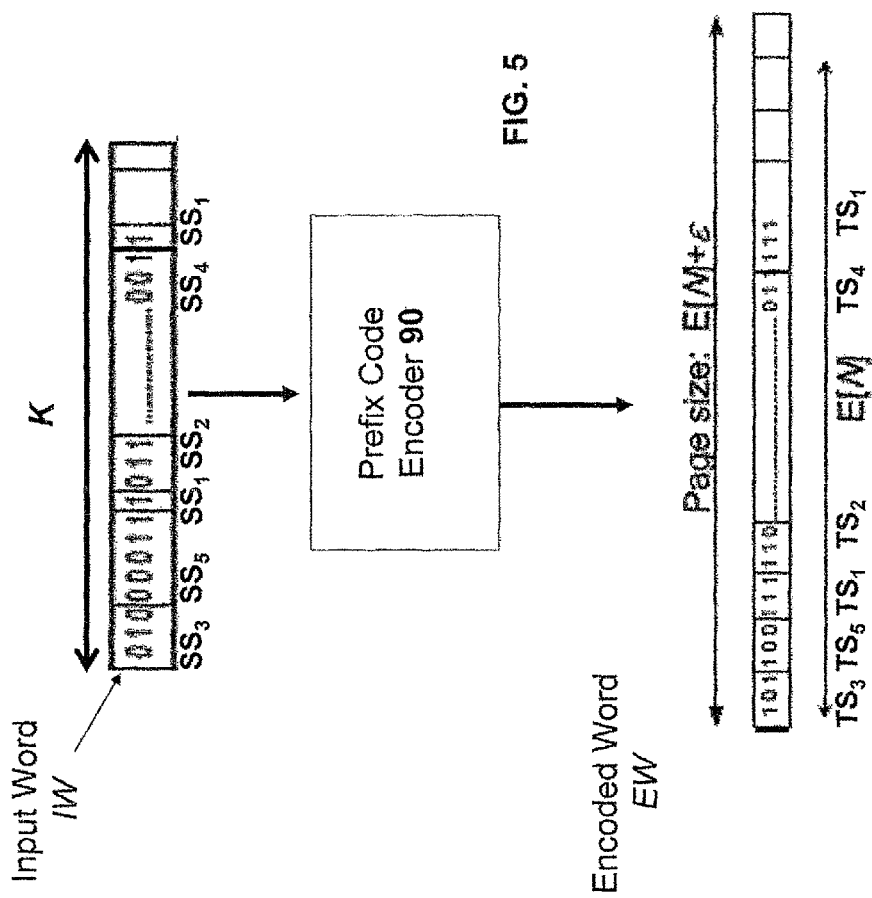
FIG. 5 illustrates prefix encoding of an input word.

Reference is made to FIG. 5, where an input word IW of length K is encoded using $CM_{RH}$ into encoded word EW of length N. Since $CM_{RH}$ is variable length mapping, the encoded word EW has variable length. Let E[N] denote the expected length of the encoded word EW. It can be shown that as the expected code length E[N] increases, the actual code length becomes highly concentrated around its expected value. Hence, if we allocate slightly more storage space than what is required according to the expected code length E[N] (e.g. E[N]+ε Flash cells, where ε<<E[N]), then with high probability we will have enough space for storing the encoded word EW.

In the example of FIG. 5, input word IW is divided or parsed into "source sequences"—i.e. the source sequences $\{SS_1, SS_2 \ldots SS_8\}$ have the property that input word IW is equal to a concatenation of M source sequences (M is a positive integer) concat($SS_{I_1}, SS_{I_2}, \ldots SS_{I_M}$), where $I_1, I_2 \ldots$ are all positive integers less than or equal to the size s of $CM_{RH}$ (in this case 8).

Thus, it is possible to take advantage of this property by (i) "dividing" or "parsing" the input word into the plurality input sequences ($SS_{I_1}, SS_{I_2} \ldots SS_{I_M}$); (ii) individually mapping each input sequence SS into a respective target sequence TS according to the s mappings (in this case 8 mappings) defined in Table 2; (iii) forming the encoded word EW from the concatenation of all of the target sequences, i.e.

$$TW = \text{concat}(TS_{I_1}, TS_{I_2} \ldots TS_{I_1}).$$

Thus, in the example of FIG. 5, the input word IW is equal to concat($SS_3, SS_5, SS_1, SS_2 \ldots$), $I_1=3, I_2=5, I_3=1, I_4=2, \ldots$ and the encoded word EW is equal to concat($TS_3, TS_5, TS_1, TS_2 \ldots$).

It is noted that the length N of the encoded word EW (E[N]+ε) depends upon the content of the input word IW—i.e. for different input words of length K the encoded word EW may have different lengths. On average over the set $2^K$ input words of length K, it is expected that the encoded word EW will have a length of E[N]. Moreover, as the expected code length E[N] increases, the actual code length N becomes highly concentrated around its expected value. Hence, by allocating a storage space of E[N]+ε for the encoded word EW, where ε<<N is some small additional storage space, we can guarantee with high probability that the actual length N of EW will not exceed the allocated storage space E[N]+ε.

Below, with reference to FIG. 8, some routines related to encoding data where the length of the encoded word is not known a priori are discussed.

Scheme A: Reverse Huffman Techniques

A Second Discussion

In the present section, an example of how to construct a variable length "prefix Reverse Huffman" endurance-enhancement code map $CM_{RH}$, based on a Huffman prefix code is presented. The length of the input word IW is K and the length of the encoded word EW is N.

Assume that we can allocate an overhead of around 33% for this scheme. I.e. N/K=1.33 and the code rate is R=K/N=¾. From the theoretical analysis presented above we know that the minimal p that can be achieved for this rate is $$p \cong H^{-1}\left(\frac{3}{4}\right) = 0.2145,$$

which corresponds to an endurance gain of $$\frac{1}{2 \cdot 0.2145} = 2.33,$$

according to a simple linear model. Hence, we can try to approach this limit by constructing an appropriate prefix code. We would like that the fraction of "0"s in the encoded sequence will be 0.2145. Consider sequences of length r=3 in the coded sequence—if indeed the probability p for "0" is 0.2145 then the probability of each length r=3 coded sequence is given in FIG. 6.

We can consider these length-3 sequences as symbols from a random source over an is alphabet of size 8, whose probability distribution function over the alphabet corresponds to probabilities of the length 3 sequences. For such a source we can construct a Huffman prefix code that will compress it optimally, as shown in FIG. 6. This procedure results in the following prefix code:

TABLE 3

| Information (SS) | Code (TS) | Probability |
|---|---|---|
| 1 | 111 | 1/2 |
| 011 | 110 | 1/8 |
| 010 | 101 | 1/8 |
| 001 | 011 | 1/8 |
| 00011 | 100 | 1/32 |
| 00010 | 010 | 1/32 |
| 00001 | 001 | 1/32 |
| 00000 | 000 | 1/32 |

It is noted that the above table provides the same mapping as $CM_{RH}$ of the previous section.

The table also includes probability for each encoded sequence, induced by the Huffman code. Based on these probabilities, it is easy to compute the expected code length which is indeed E[N]=1.33*K, and the expected fraction of "0"s in the code which is p=0.2188. As can be seen, this simple construction, which may also be simple for implementation, provides near optimal gain of $$\sim \frac{1}{2 \cdot 0.2188} = 2.2852$$

compared to the theoretical gain limit of 2.33 for this code rate.

Scheme A: Reverse Huffman Techniques

A Third Discussion

Some Additional Observations about $CM_{RH}$

It is noted that $CM_{RH}$ is a "variable length map"—i.e. one or more of the following conditions are true:

CONDITION 1: there exist at least two integers $i_1$ and $i_2$ such that $size(TS_{i1})=size(TS_{i2})$ and $size(SS_{i1}) \neq size(SS_{i2})$ [in the above example for the sample $CM_{RH}$, we have $i1=1$ and $i2=2$ thus $size(TS_1)=3$ and $size(TS_2)=3$ but $size(SS_1)=1$ and $size(SS_2)=2$]; and/or CONDITION 2: there exist at least two integers $i_1$ and $i_2$ such that $size(TS_{i1}) \neq size(TS_{i2})$ and $size(SS_{i1})=size(SS_{i2})$;

In some embodiments, the transformation is made in accordance with a "variable length map."

Another salient feature of $CM_{RH}$ is that $CM_{RH}$ is a "prefix" mapping—i.e. for every i,j where $i \neq j$, and where i and j are positive integers less than or equal to $SIZE(CM_R)$, we write that $SS_i$ is not a prefix of $SS_j$ and/or that $TS_i$ is not a prefix of $TS_j$ for all $i \neq j$.

We also note that for at least some of the possible mappings $SS_i \to TS_i$, that $size(TS_i) < size(SS_i)$.

In some embodiments, the "code map" CM is a "covering code map" for words (i.e. of binary numbers) of length K (for example, where K is greater than 20 or 50 or 100 or greater than 1,000) such that every possible binary sequence of the $2^K$ possible binary sequences may be constructed by a concatenation function of source sequences SS of the code map.

In some embodiments, the code map CM is a "partly spanning" code map or "mostly spanning" code map such that for words (i.e. of binary sequences) of length K (for example, where K is greater than 20 or 50 or 100 or greater than 1,000) a portion (i.e. at least 20% or 50% or 80% or 90%) of possible (i.e. distinct) binary sequence of the $2^K$ possible binary sequences may be constructed by a concatenation function of source sequences SS of the code map.

In some embodiments, the method of encoding from IW to EW (see FIGS. 5 and 7) is carried out for thousands or tens of thousands or hundreds of thousands or millions or tens of millions of distinct input words IW over a length at least 20 or 50 or 100 or 1,000.

It is also apparent from $CM_{RH}$ that a portion of the mappings SS→TS are "expanding mapping" where length(TS)>length(SS) (i.e. the mapping between $SS_1$ and $TS_1$ where length(SS)=1 and length(TS)=3), a portion of mappings from SS→TS are "length preserving" where length(TS)=length(SS), and a portion of mappings from SS→TS are "compressing mappings" where length(TS)<length(SS).

Looking in the previous section (see the 'probability' column of Table 3), it is noted for the particular case of $CM_{RH}$ that the frequency of "expanding mappings" (i.e. the frequency over a 'large' number of thousands or millions or more of distinct input words) is 50% (and is less than 90%, less than 75%, and more than 20% and more than 35%), the frequency of "length-preserving mappings" is ⅛+⅛+⅛=37.5% (and is less than 66%, less than 50% and is more than 20% and more than 30%), and the frequency of "length compressing" mappings is 4/32=12.5% (and is more than 1%, more than 2%, more than 3% and more than 5%).

Figure 7:
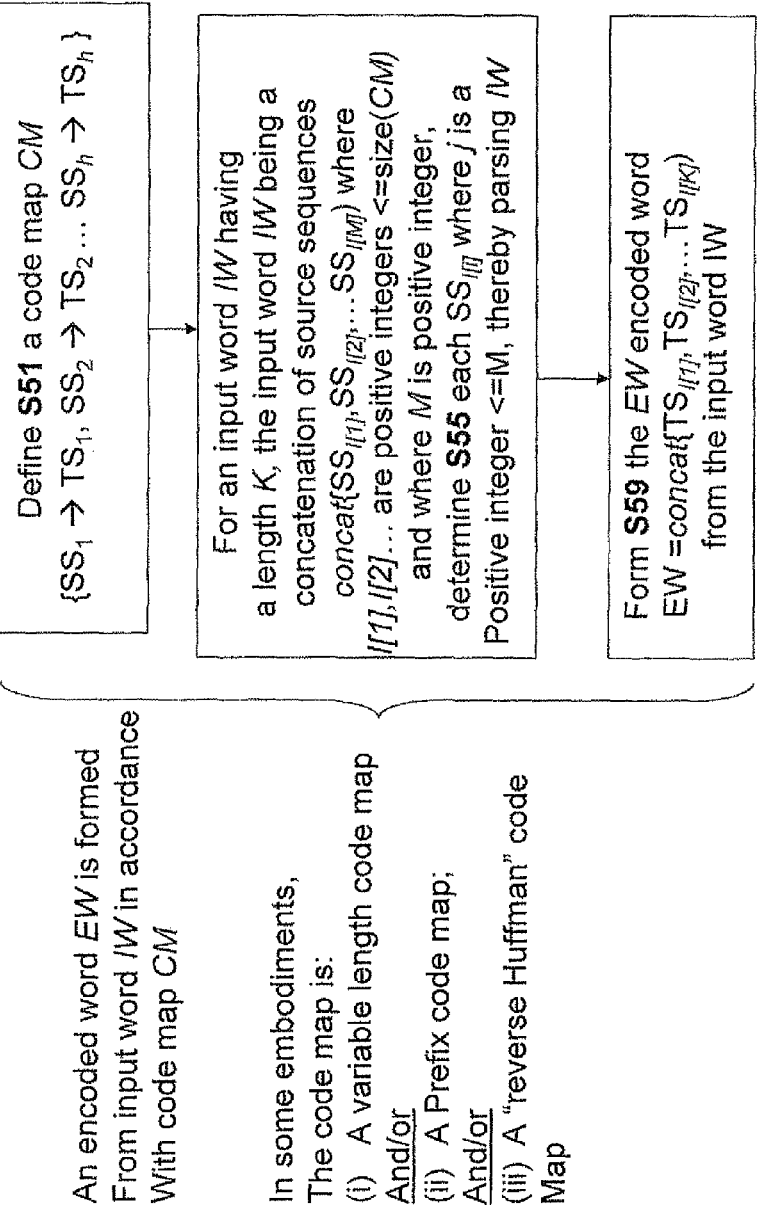
FIG. 7 is an exemplary expansion of the middle block of FIG. 2.

FIG. 7 is a flow chart of an exemplary technique for mapping input words IW to encoded words EW. In step S51, a code map CM is defined—the code map may be stored in any combination of volatile and/or non-volatile memory—exemplary locations include but are not limited to within flash controller 280, and within flash memory 270. In step S55, for an input word IW having a length K is mapped, according to code map CM.

In step S59, the encoded word is formed from the input word, and is defined by the concatenation of the target sequences TS.

It is noted that FIG. 7 includes both determining parsing operations (i.e. determining the source sequences and/or borders between source sequences) and mapping operations (i.e. between the source sequences SS and the target sequences TS). It is noted that there is no limitation upon the order of how the parsing and mapping operations carried out other than what is absolutely necessary—otherwise, these operations may be carried out in any order.

Figure 8:
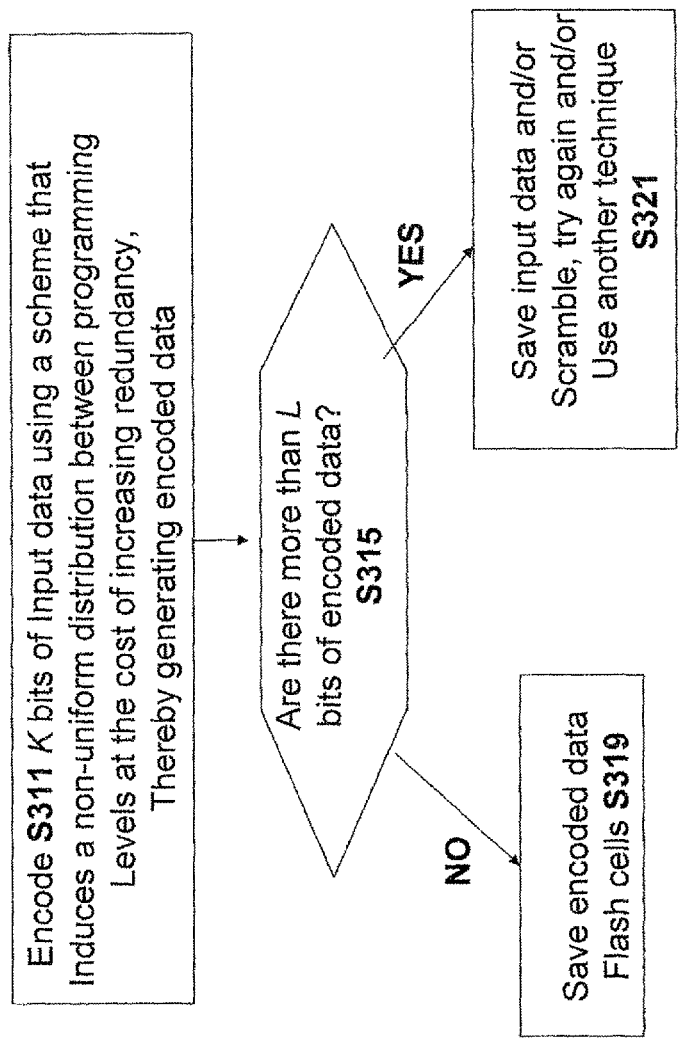
FIG. 8 is a flow chart of a trial and error technique for encoding and storing data.

A Discussion of FIG. 8

As noted earlier, it is practically unfeasible to maintain a coding map for "large enough" input words (i.e. for input words IW of a size of at least 20 or at least 50 or at least 100 or at least 1,000) because the number of possible input words is $2^K$.

As noted earlier, for at least some 1, the difference between the length of the i-th source sequence $SS_i$ and the length of the corresponding target sequence $TS_i$, may be (i) non-zero; and (ii) dependent on the value of i. Thus, when an input word IW is received, the length of the encoded word EW is typically not known exactly (exact knowledge would require the maintaining a table whose size is prohibitive) in advance, and can only be estimated. This may pose a problem, as typically the space in which the encoded word will be stored needs to be reserved in advance. In the event that "too-much" space is reserved (i.e. so for all practical purposes, there is a case where the size of the encoded word exceeds the amount of reserved space), then a certain amount of memory will on average be "wasted," thereby reducing the "efficiency" of the technique.

Thus, in some embodiments, the length of encoded word generated in step S215 of FIG. 2 may exceed the amount of the space reserved for storage in the flash memory.

Let us denote by E[N] the expected length of the encoded word EW. It can be shown that as the average code length increases, the code length becomes highly concentrated around its expected value. Hence, if we allocate slightly more storage space (i.e. Flash cells) than what is required according to the expected code length E[N], then with high probability we will have enough space for storing the codeword. In the rare event that the specific information sequence results in a codeword which is longer than the allocated storage space, then we can take one or more of the following actions (or another action):

1) Assuming information is scrambled prior to encoding (as done in modern Flash memories), we can repeat the encoding after re-scrambling the information with a different seed. In this case we need to store additional information on the seed that was used for scrambling (e.g. store an additional bit indicating if we used the first seed or the second seed, in case we do only two attempts).

2) Program the input word (or some derivative thereof) directly. This will always be possible since K<E[N]. If we use such an option we may need to store one additional bit indicating whether information was programmed directly, or programmed after the encoding—this is required in order to be able to recover the information during reading.

FIG. 8 is a flow chart of a "trial-and-error" technique for encoding and storing data. In the example of FIG. 8, it is desired to encode the data and store the data in an area of memory whose capacity is L bits where L is a positive integer. In step S311, K bits of input data are encoded using a scheme that induces a non-uniform distribution over the programming levels at the cost of increasing the "shaping" redundancy (for example, according to a "reverse Huffman technique" or any other technique). In one example, the encoded word EW is stored in volatile memory before being written to non-volatile memory—for example, in volatile memory of a device controller.

In step S315, it is determined if the number of bits of the encoded word EW exceeds L bits. In the event that the number of bits of the encoded word does not exceed L, the encoded word is saved to non-volatile memory (for example, to flash cells) in step S319. Otherwise, either the input data itself (or some derivative thereof which is different from the EW) is saved to non-volatile memory and/or the input data is scrambled and a new encoding is attempted (i.e. returning to step S311) or some other representation of the data is eventually saved to non-volatile memory.

Figure 9:
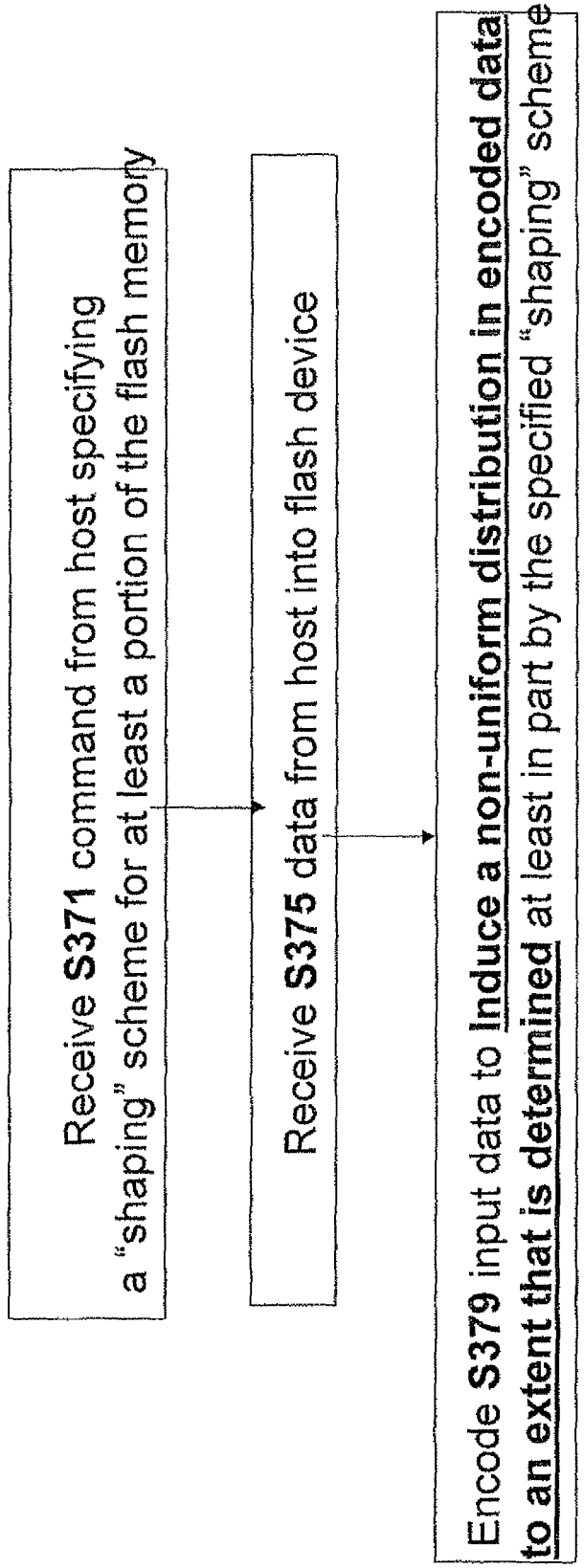
FIG. 9 is a flow chart of a procedure for encoding for a desired "shaping" level.

A Discussion of FIG. 9

Although certainly not a requirement, in some embodiments, a command is received by flash device 260 from host device 310 via respective interfaces 350, 250. This command includes an indication, of a requested effective "shaping" level of the probability distribution that is to be induced over the programmed states, that is requested by the host device for flash memory 270 or a portion thereof. In order to provide the effective shaping scheme, it is necessary to sacrifice a certain amount of capacity of flash memory 270 using one or more "data shaping schemes" disclosed herein.

Thus, in step S371, a command is received from the host specifying a shaping scheme for at least a portion of the flash memory. In step S375, data (i.e. a representation of which is to be written to flash memory) is received from the host. In step S379, the input data (i.e. which is representative of the received data) is encoded in accordance with an encoding scheme selected in accordance with the received effective shaping scheme. Thus, in step S379, an encoding for inducing a non-uniform distribution in programming levels is used—the extent of the induced non-uniform distribution is selected in accordance with the requested effective shaping scheme.

Figure 10:
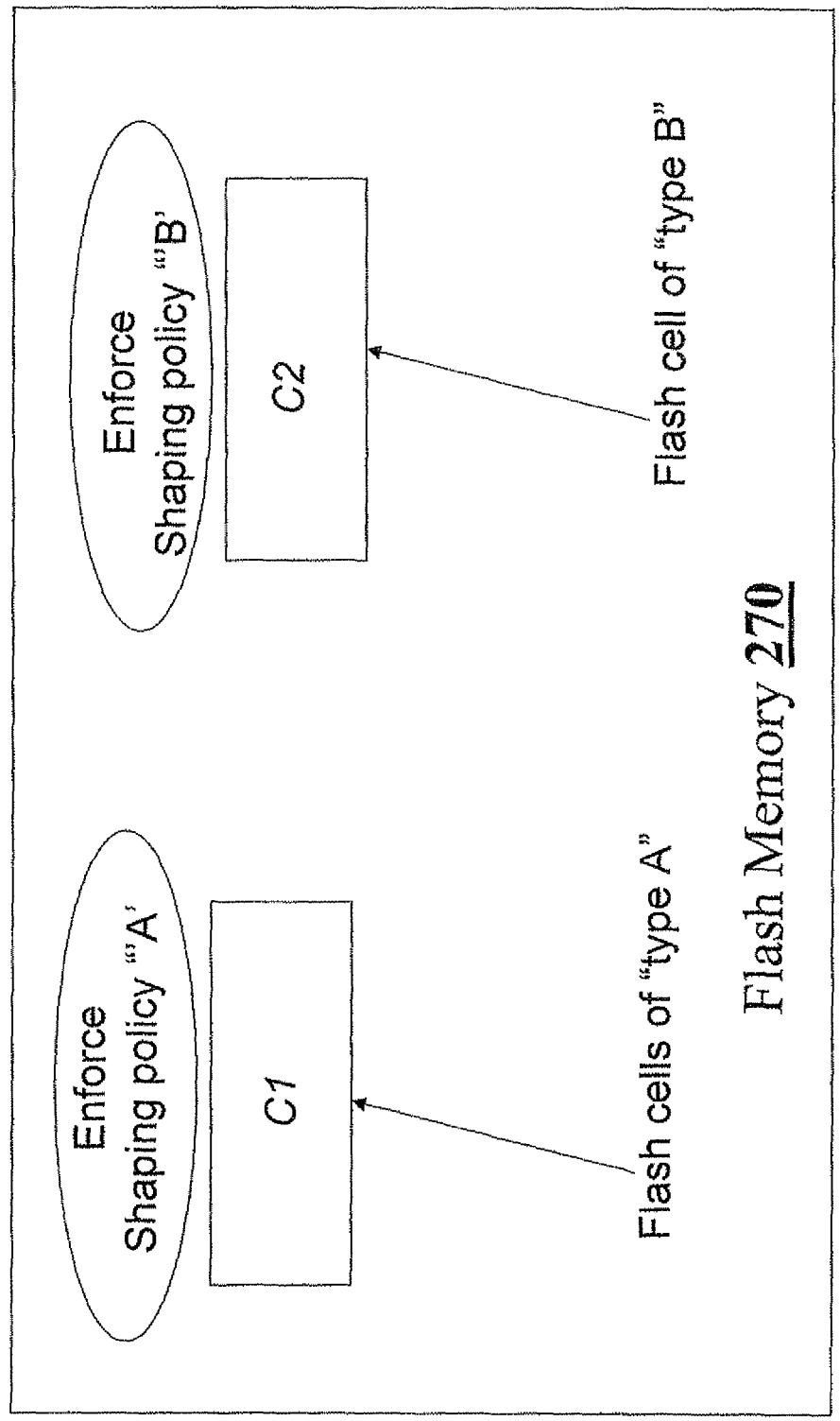
FIGS. 10 and 12C illustrate flash memories with two types of flash cells.
Figure 11:
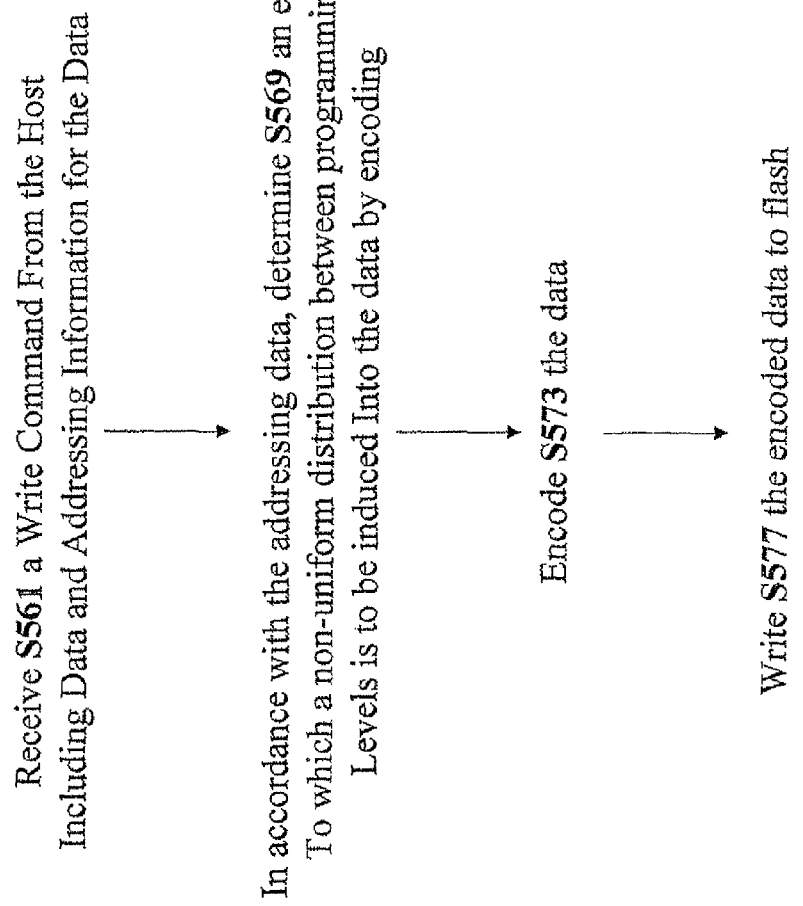
FIG. 11 is a flow chart of encoding and storing data at specified addresses.

A Discussion of FIGS. 10-11

It is noted that in some embodiments, flash device 260 (for example, flash controller 280) is configured so that: (i) a first shaping policy is enforced for data to be stored in location C1, or for data of type C1; (ii) a second shaping policy is enforced for data to be stored in location C2, or for data of type C2.

The two data shaping policies differ from each other—in one example, only data stored to C1 (C2) is shaped to induce the non-uniform distribution before written to region C1 (C1), while data to be stored to region C2 (C1) is not shaped before storage.

Alternatively, data to be stored to both C1 and C2 are both shaped before storage to non-volatile memory, however the degree of shaping differs for each region.

In some embodiments, the different policies are enforced in accordance with one or more properties where regions C1 and C2 differ—for example, the number of storage levels may differ.

In another example, the amount of data shaping of data to be stored to either region may be a function of how many previous write cycles the region has endured—for example, if a region has endured more write cycles, it is assumed that the probability of failure is higher, and that there is more of a need to induce a greater non-uniform endurance (even at the expense of lost capacity) before writing the data to non-volatile memory. Thus, in one example, the number of previous write cycles that C1 and C2 have endured is different—for example, a "more extreme data shaping policy" may be enforced only for the region which has endured more write cycles.

In another example, the amount of data shaping of data to be stored to either region may be a function of the importance of the data. Data of higher importance is shaped for relatively high endurance and consequently with relatively less compact storage. Data of lower importance is shaped for relatively low endurance and correspondingly more compact storage.

In yet another specific example (see FIG. 11) where the techniques of FIG. 10 may be applied, both data and addressing information for the data (i.e. an indication of where within flash memory 270 the data is to be stored) is received in step S561 by non-volatile memory device 260 from the host 310. In step S569, in accordance with the addressing data (which is indicative of a physical or logical 'target location' within non-volatile memory 270 to which a representation of the data is to be stored), an extent to which a non-uniform distribution between programming levels is to be induced into the data (i.e. an extent of 'shaping').

In step S573, the data is encoded according to the determined degree of shaping of step S569. In step S577, the shaped, encoded data is written to flash (i.e. to the location indicated by the received addressing information).

Figure 12A:
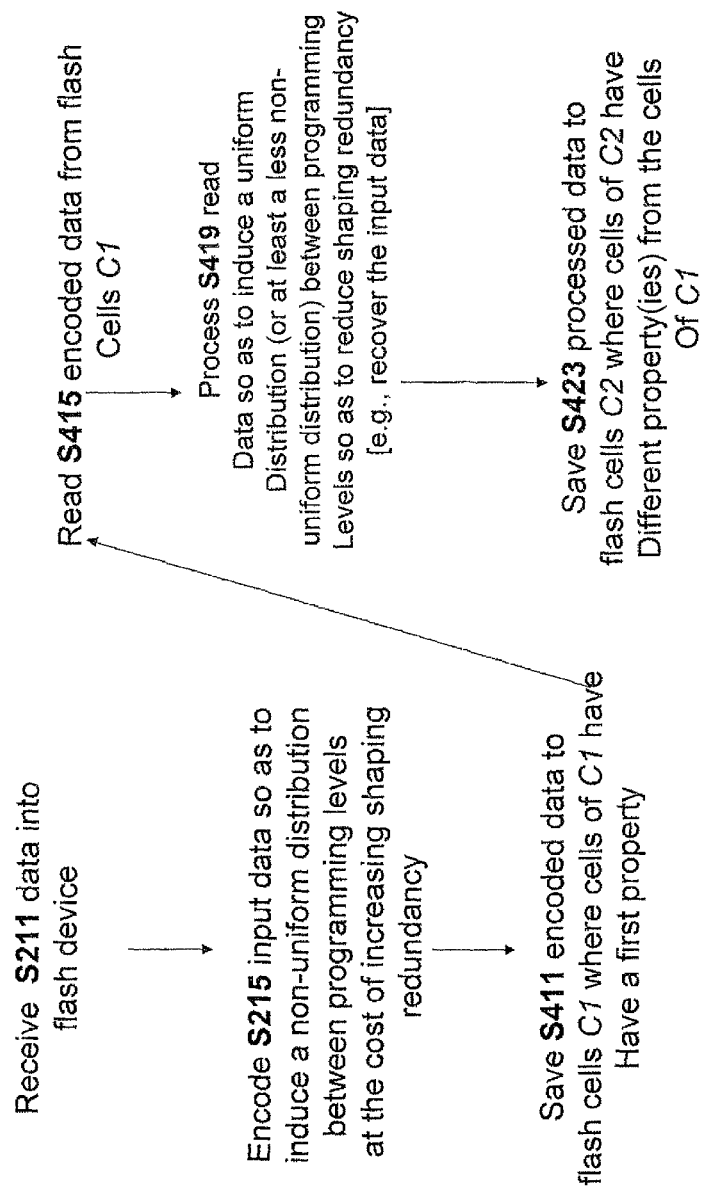
FIG. 12A is a flow chart of encoding and storing data in type A flash cells of FIG. 10 and then in type B flash cells of FIG. 10 or of FIG. 12C based on properties of the two types of cells.
Figure 12B:
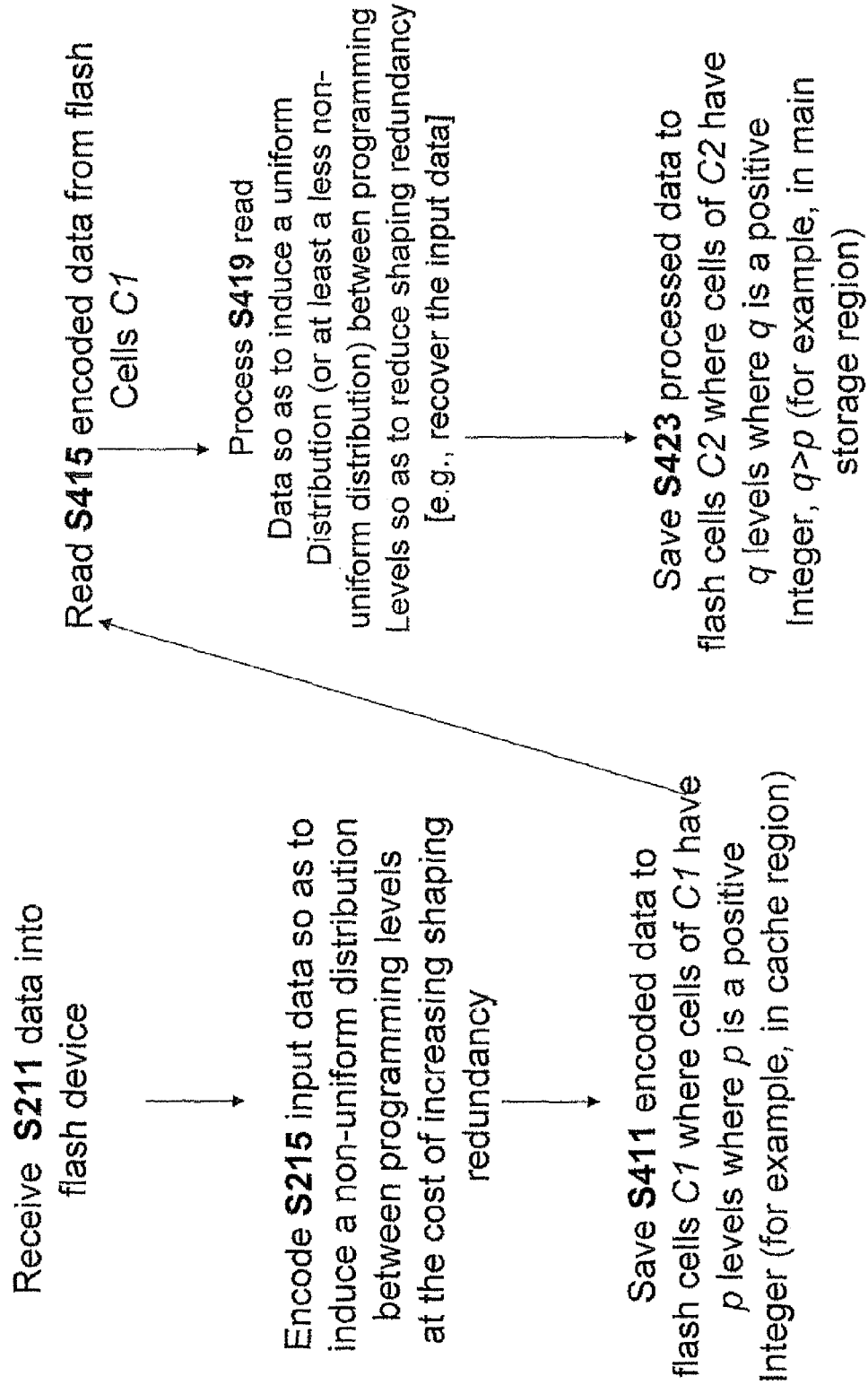
FIG. 12B is a flow chart of encoding and storing data in type A flash cells of FIG. 10 and then in type B flash cells of FIG. 10 or of FIG. 12C based on the numbers of programming levels of the two types of cells.
Figure 12C:
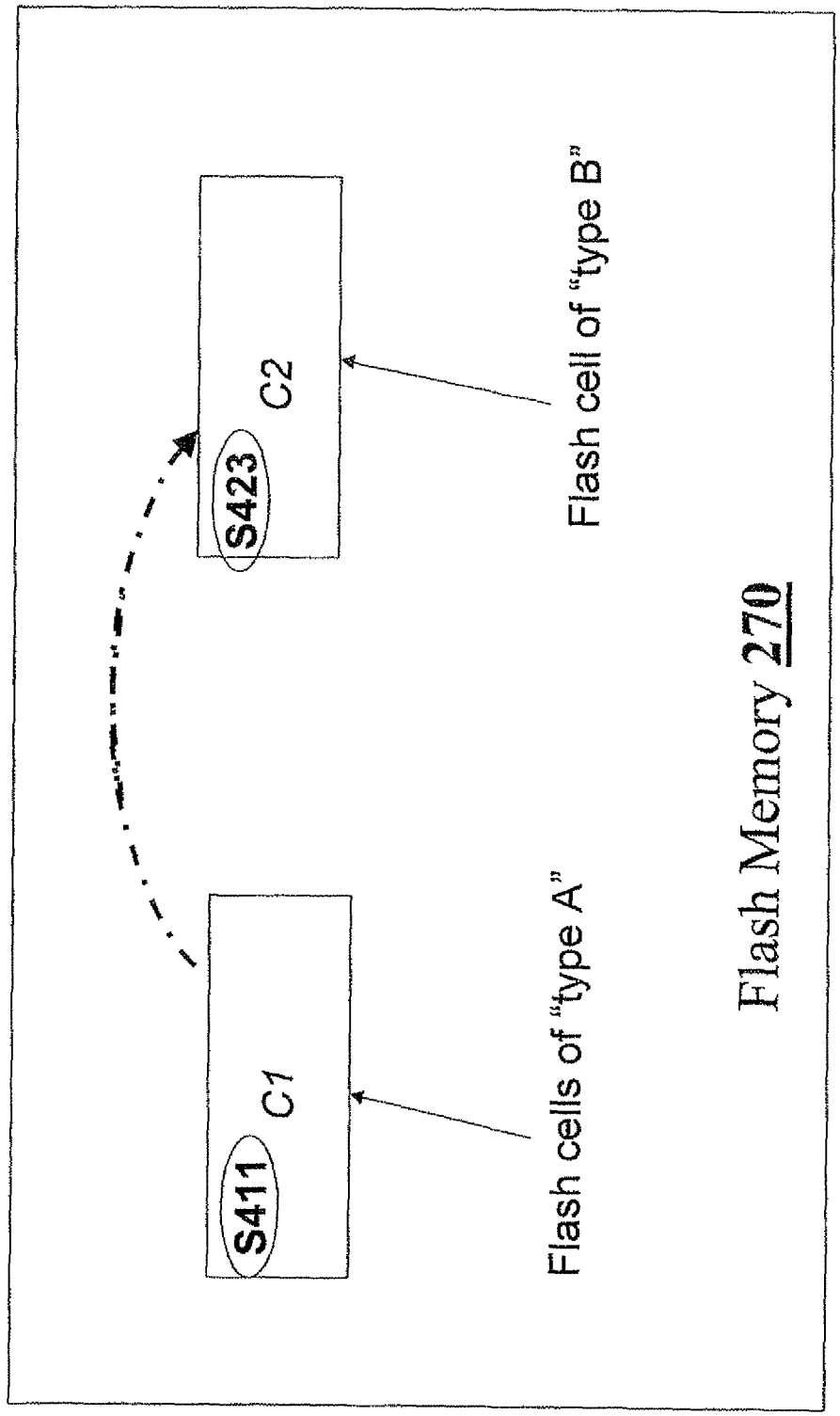

A Discussion of FIGS. 12A-12C

Reference is made to FIGS. 12A-12C. Steps S211 and S215 are as in FIG. 3. In step S411, the encoded data is saved to flash cells having a first property (for example, a number of levels of cells, programming pulse properties associated with the cells). In step S415, the encoded data (i.e. the data which was 'shaped' in step S215) is read back (for example, into volatile memory).

In step S419, the data is processed (for example, decoded to obtain the original data which was shaped in step S215, or, for example, re-shaped) to induce a less non-uniform distribution than the distribution produced in step S215 (for example, by decoding the data).

In step S423, the processed data (for example, decoded or re-shaped) is written to flash cells C2.

Figure 13A:
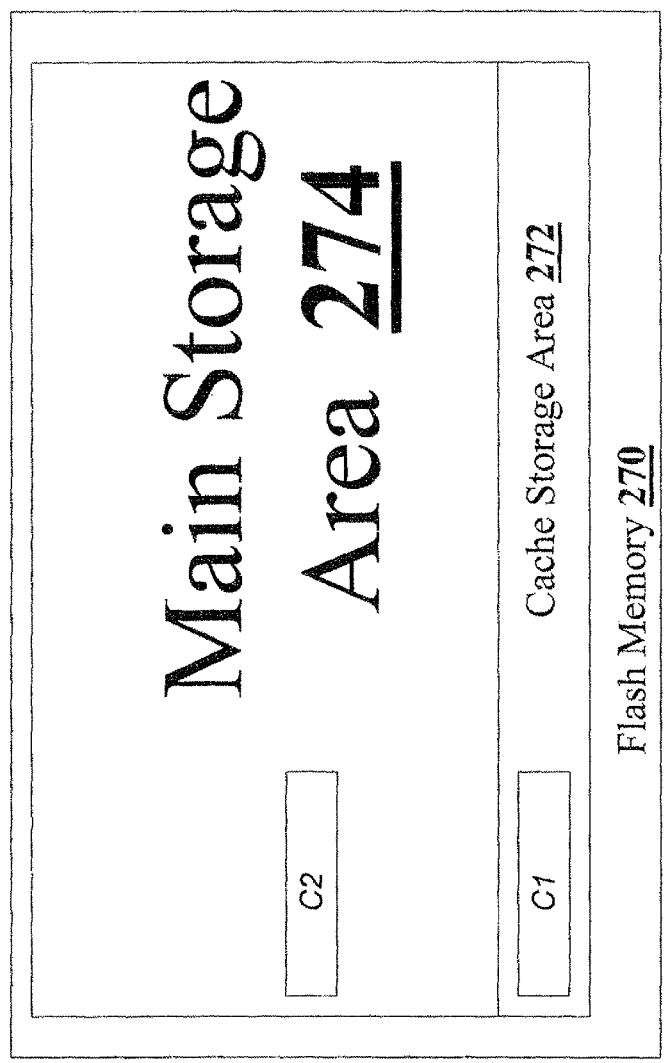
FIGS. 13A and 13B illustrate a variant of the flash memory of FIG. 10 or FIG. 12C in which the type A cells are used for cache and the type B cells are used for main storage.
Figure 13B:
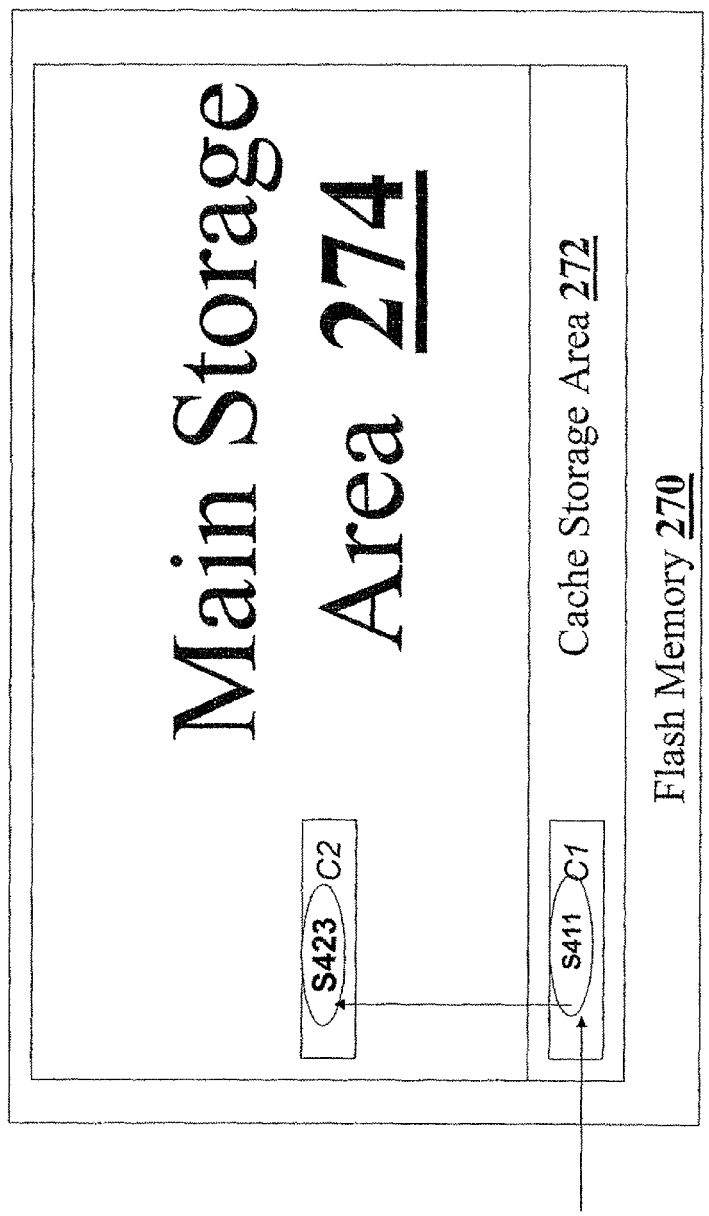

A Discussion of FIGS. 13A-13B

In some embodiments, the cells to which the data is first written in step S411 (i.e. cells of area C1) are part of cache storage area 272, and the cells to which the data is later written in step S423 (i.e. cells of area C2) are part of main storage area 274.

In one example, the cells of area C1 of cache storage area 272 have p levels and the cells of area C2 of main storage area 274 have q levels. In a particular example, p<q—for example, data is first stored "quickly" to the cache area in order to provide a "responsiveness" and "fast data storage" to host 310—for example, because data storage to cells with fewer levels may be much faster than data storage to cells with more levels. Later, the data is copied to the "denser" (i.e. in terms of ability to store more data per cell) cells of the main storage area 274.

Thus, in some embodiments, the amount of "shaping redundancy" (and hence the amount of endurance enhancement) needed for storage in the cache area is greater (i.e.

because data writings are much more frequent) than the amount of endurance needed in the main storage area 274.

Thus, in some embodiments, a greater amount of "data shaping" is used for the cache storage area than for the main storage area.

Thus in some embodiments, a technique for increasing the W/E cycling endurance in a flash device is provided, in which some of the blocks are intended to be programmed with p levels and other blocks are intended to be programmed with q levels, where $p \neq q$.

Figure 14A:
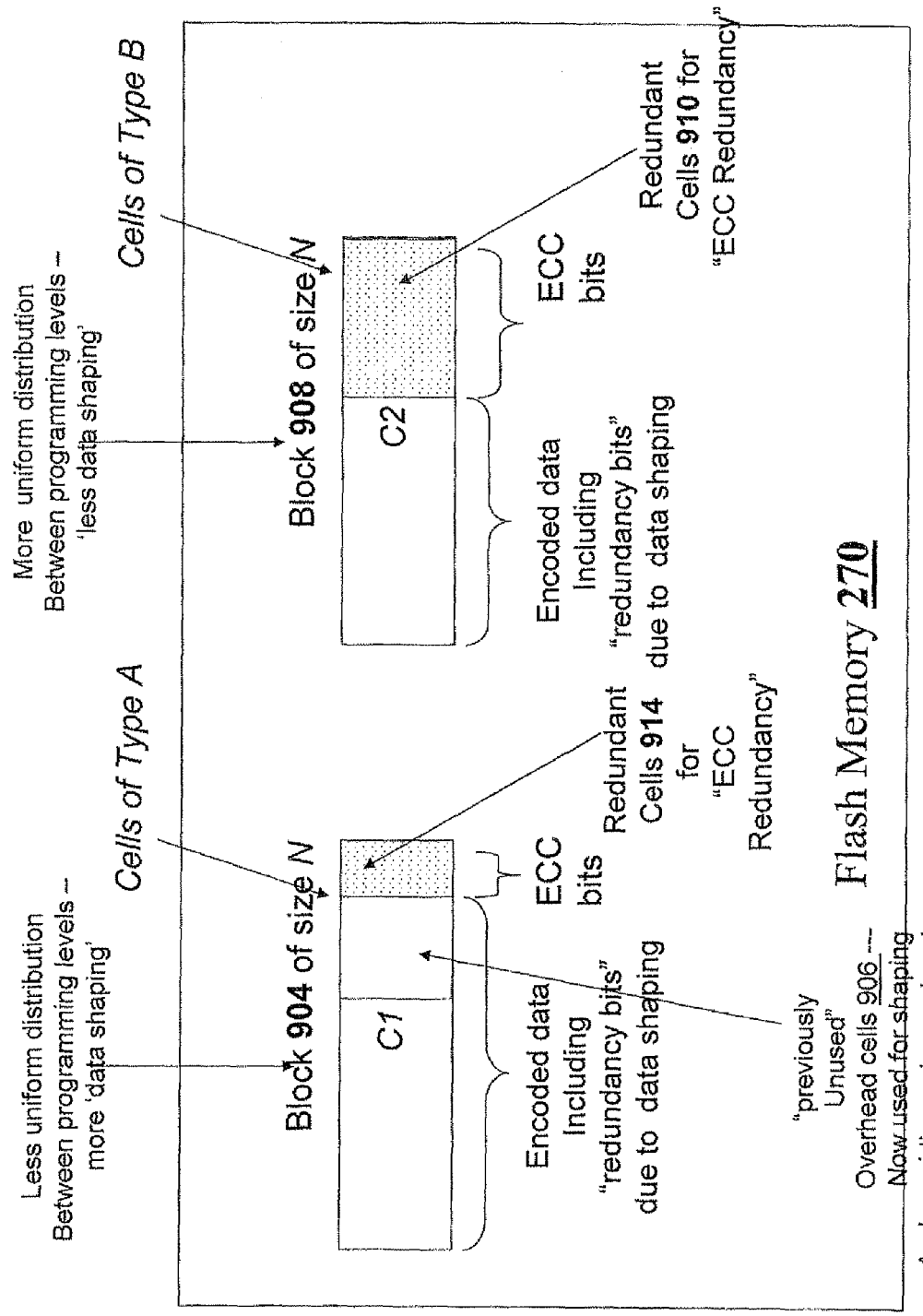
FIGS. 14A and 14B illustrate the use of flash memory cells, that are not needed to store ECC redundancy bits, for shaping redundancy purposes.
Figure 14B:
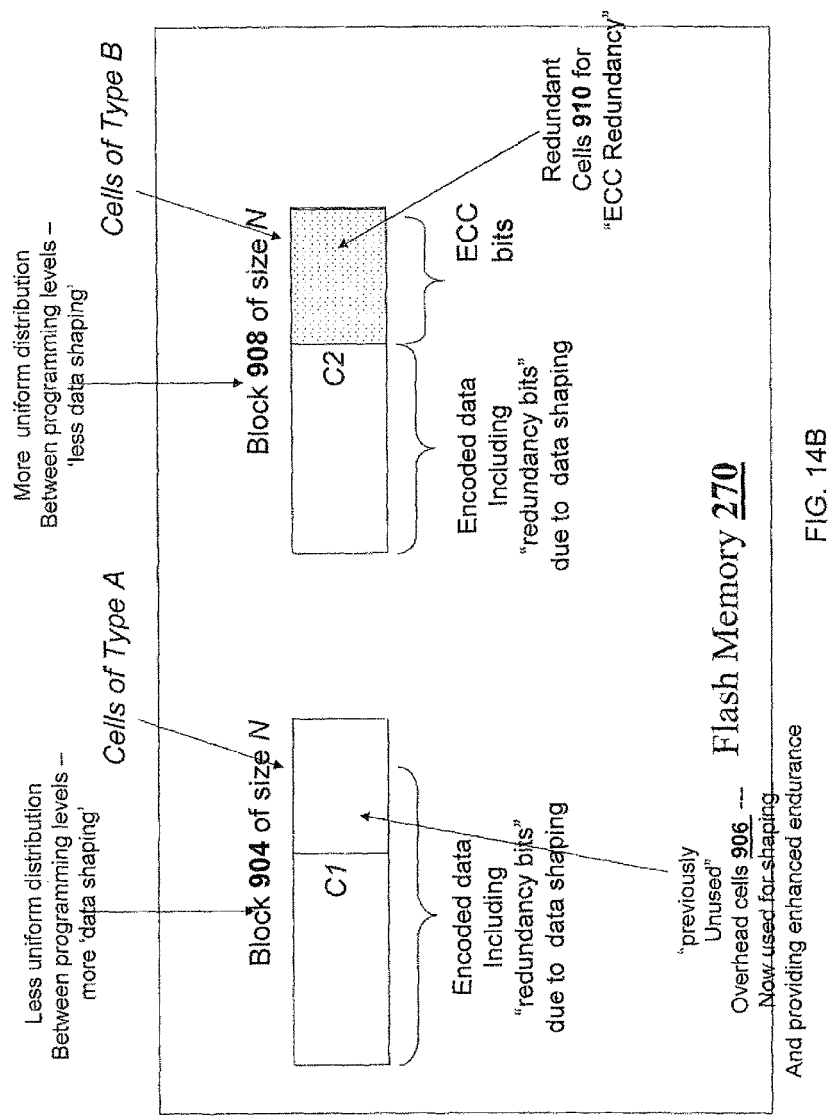

A Discussion of FIG. 14

In some embodiments, the proposed endurance enhancement schemes may be implemented at no additional cost in terms of overhead. One example is multi-bit-per cell Flash memory 908, where a certain amount of overhead is allocated for sake of Error Correction Coding (ECC). The redundant cells 910 (i.e. ECC-related redundancy which does not necessarily introduce a non-uniform distribution between programming states) are used for protecting against data corruption due to high error rates exhibited by such Flash cells (i.e. cells with more levels may have higher error rates than cells with fewer levels). However, in such memories, some of the blocks 904 are usually designated for storage of single-bit-per cell, providing higher reliability and faster write and read throughputs. E.g. blocks allocated for the Flash file system and management and blocks allocated as a binary cache. Since the cells in these blocks 904 store only a single bit (two programming levels), they exhibit much lower error rates and need much smaller overhead 914 for ECC. Hence, this overhead is available at no cost for implementing the endurance enhancement schemes described herein (i.e. whereby a non-uniform distribution is induced at the cost of "shaping-redundancy"). Note that these schemes fit very nicely here since these specific blocks 904 (e.g. Flash management and binary cache blocks) also tend to require increased W/E cycling endurance, which can be provided by the techniques described herein.

In some embodiments, data is copied from block 904 to block 908—when the data is copied (1) the amount of "shaping-related" redundancy (i.e. causing a non-uniform distribution) is reduced (i.e. by processing and/or decoding and/or re-encoding—see FIGS. 12A-12B); (ii) ECC-related redundancy is introduced and/or increased.

It is appreciated that although a "systematic ECC" scheme is illustrated in FIG. 14, the technique can be also applied to "non-systematic ECC."

Combining ECC Coding with Endurance Enhancement Coding

Note that the endurance enhancement coding can be combined with ECC coding. In some embodiments, this is carried out by performing the ECC encoding after the endurance enhancement encoding. This way, during reading we first perform ECC decoding, which provides us with the error-free stored bits. We then perform the endurance enhancement code decoding and recover the stored information. In case that the ECC redundancy is small (as is usually the case in Flash memories and especially in the ease of single-bit-per-cell Flash), the fact that the endurance enhancement coding is performed only on the information part and not on the ECC redundancy part, has negligible effect on the solution's efficiency. However, a practical problem that might arise in this case is that the cells storing the FCC redundancy will be worn out faster than the cells storing the information, since only the information part is encoded with the endurance enhancement coding that reduces the expected fraction of programmed cells. A possible solution to this problem is to change the location of the ECC redundancy from one programming operation to another (i.e. store the ECC redundancy bits in different cells in each programming). In this case, the number of programming operations that were performed needs to be tracked in order to know where the ECC redundancy is located, but this is usually done anyway by Flash management systems. Another possible solution is to allocate storage space for more than one set of ECC redundancy bits. This solution is less efficient in terms of overhead, but may be attractive if ECC redundancy is very small. In this solution, during each programming the ECC redundancy bits are stored in a different location in the allocated space. During reading, the system either identifies where the ECC redundancy is located based on the number of programming operations that were done, or, alternatively, a logical "AND" operation is performed between the different sets of ECC redundancy bits (for which only one set is valid and the other sets store "1"'s since they are erased).

In some embodiments, knowledge about the non-uniform distribution between programming levels can be used to provide "better error correction." Thus, in one example, in the case ECC coding is combined with endurance enhancement coding, a soft ECC decoder can use a-priori knowledge of the distribution over the programming levels in order to increase error correction capability. I.e. initial "soft" bit estimates (LLRs) can take into account the a-priori probability of each bit to be "0" or "1" induced by the endurance enhancement coding scheme (which is not ½). This means that some of the redundancy wasted on the endurance enhancement code may be gained back for error correction.

First Additional Discussion

Some embodiments provide a coding technique that reduces cell wearing.

Some embodiments provide a coding technique that mitigate data-dependent noises such as "program disturb".

Some embodiments provide a coding technique that maps information bit sequences into programming level sequences that are expected to induce less cell wearing.

Some embodiments provide a coding technique that maps information bit sequences into programming level sequences that are expected to mitigate data-dependent noises such as "program disturb".

Some embodiments provide a coding technique that maps information bit sequences into programming level sequences which have non-uniform distribution, such that the expected cell wearing induced by this distribution is smaller than that of the uniform distribution.

Some embodiments provide a coding technique that maps information bit sequences into programming level sequences which have non-uniform distribution, such that the expected data-dependent noises, such as "program disturb", induced by this distribution is smaller than that of the uniform distribution.

Some embodiments provide a coding technique that uses a non-linear code for inducing non-uniform distribution with a downward bias over the programming levels.

Some embodiments provide a coding technique that uses an enumerative source coding technique for inducing non-uniform distribution over the programming levels, for sake of increasing W/E cycles endurance and/or for the sake of mitigating data-dependent noises such as "program disturb".

Some embodiments provide a coding technique that uses a trellis shaping technique for inducing non-uniform distribution of programming levels.

Some embodiments provide a coding technique that maps information bit sequences into coded bit sequences whose expected number of "0'"s is less than the expected number of "1'"s. Alternatively, a technique that maps information bit sequences into coded bit sequences whose expected number of "0'"s is more than the expected number of "1'"s.

Some embodiments provide a coding technique that maps information bit sequences into high/low weight codewords. I.e. expected codeword weight over the codebook is strictly higher/lower than 50%. Note that even a scheme with no ECC and possibly just a scrambler can be considered as a rate 1 linear code.

Some embodiments provide a coding technique that uses a variable length coding scheme: i.e. variable length sequences of information bits are mapped into fixed length sequences of coded bits. Other combinations are also possible—e.g. variable information length to variable codeword length, or fixed information length to variable codeword length.

Some embodiments provide a coding technique that uses a prefix code: variable length sequences of information bits are mapped to codewords, such that no sequence of information bits constitutes a prefix of another sequence.

Some embodiments provide a coding technique that uses the Huffman prefix code, in order to induce a specific distribution of states with the minimal required redundancy. Note that the way the Huffman code is used in the scheme described herein is not the standard way of using a Huffman code. Conventionally, Huffman codes are used for compressing sequences with a given distribution into binary vectors (whose expected length is as close as possible to the sequence entropy). i.e. a conventional Huffman encoder is used for compressing the sequence into bits and a conventional Huffman decoder is used for translating the bits back into the original sequence. Here, Huffman coding is used differently—i.e. the Huffman decoder is used for decompressing a sequence of information bits into a sequence of states with a desired distribution. The Huffman encoder is used to translate the sequence of states back into the original information bits. Moreover, in some cases (e.g. the SLC case) the sequence at the output of the Huffman decoder is not stored directly into the Flash—instead it first is transformed into a sequence of states corresponding to the programmable states of the Flash (e.g. map the sequence back into bits in the case of SLC) and only then store the transformed sequence.

Some embodiments provide a technique that employs a probabilistic scheme that maps an information sequence into a codeword and if this codeword cannot be stored in the Flash then the original sequence is stored. E.g in a scheme utilizing a variable length code—if the codeword is too long (e.g. not enough cells in a flash wordline to store the codeword) then the original information sequence is stored.

Some embodiments provide a technique that employs a probabilistic scheme: a scheme that maps a scrambled information sequence into a codeword and if this codeword cannot be stored in the Flash then the information sequence is scrambled again and mapped to a new codeword. This process can be done repeatedly until codeword is adequate for storage (e.g. the length of the codeword is not too large).

Some embodiments provide a combination of the endurance enhancement scheme with an ECC. Information is encoded with the endurance enhancement code then coded with an ECC. A soft ECC decoder can use a-priori knowledge of the distribution over the programming levels in order to increase error correction capability. I.e. initial "soft" bit estimates (LLRs) take into account the fact that the bits have a-priori probability for "0"/"1" which is not ½. This means that some of the redundancy wasted on the endurance enhancement code is gained back for error correction.

Some embodiments provide a coding technique that combines endurance enhancement coding with ECC, such that ECC encoding is done on the output of the endurance enhancement encoder. In this case there may be a problem that cells storing the ECC redundancy will be worn out faster. This problems can be solved by, for example:

a. Changing ECC redundancy location between programming operations.

b. Allocating storage space for more than one set of ECC redundancy bits and changing the location of the ECC redundancy bits within this space between programming operations.

Second Additional Discussion

Some embodiments provide a technique for increasing the W/E cycling endurance in a Flash device, and/or for mitigating data-dependent noises such as "program disturb", in which some of the blocks are intended to be programmed with p levels and other blocks are intended to be programmed with q levels, where p≠q.

Some embodiments provide a technique for increasing the W/E cycling endurance, and/or for mitigating data-dependent noises such as "program disturb", in management and file system (binary) blocks of a multi-bit-per-cell Flash device.

Some embodiments provide a technique for increasing the W/E cycling endurance, and/or for mitigating data-dependent noises such as "program disturb", in (binary) cache blocks of a multi-bit-per-cell Flash device.

Some embodiments provide a technique that utilizes unused cells for endurance enhancement coding and/or for data-dependent noise mitigation coding.

Some embodiments provide a technique that utilizes unused ECC redundancy cells for endurance enhancement coding and/or for data-dependent noise mitigation coding. E.g. a wordline in a multi-bit-per-cell Flash device contains ECC redundancy for allowing reliable operation of the Flash. In certain cases this wordline stores fewer bits per cell than the maximal allowed number (e.g. binary cache). In this case less redundancy is required for allowing reliable operation and some cells are unused and are available for endurance enhancement coding and/or for data-dependent noise mitigation coding.

Some embodiments provide a technique for endurance enhancement coding and/or for data-dependent noise mitigation coding over several wordlines.

Figure 15:
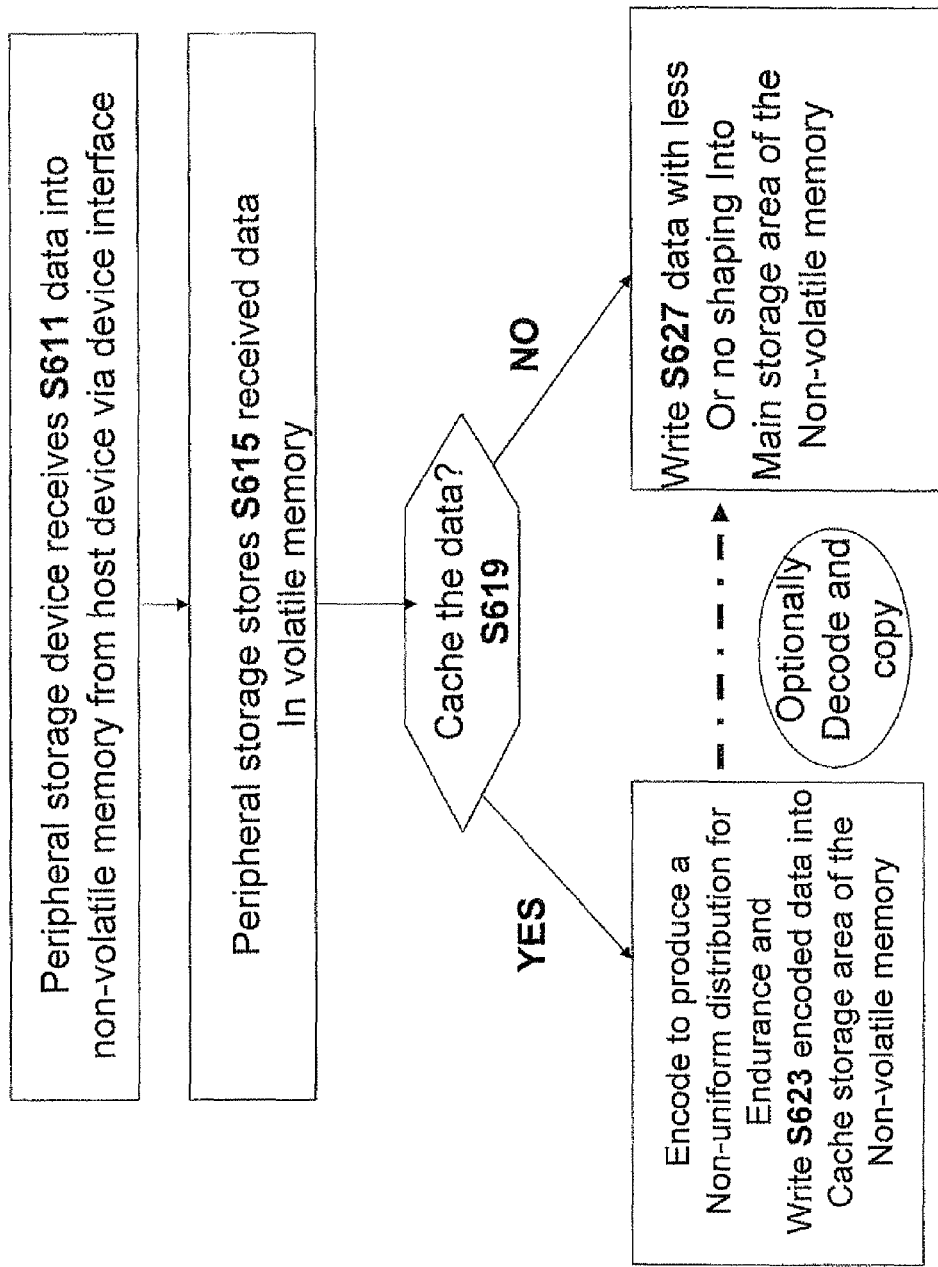
FIG. 15 is a flow chart of caching with shaping encoding.

A Brief Discussion of FIG. 15

As illustrated in FIG. 15, sometimes when data is received into the flash device, a decision is made about whether (i) to first store the data to cache (i.e. the yes branch) before storing to main storage or (ii) to not first cache the data.

This decision may be made in accordance with a number of factors—for example, a rate at which data is received from the host device (where a higher rate would favor caching since writing to cache is often faster).

It is noted then that the "cache/no cache" decision may be related to a decision pertaining to whether or not to "shape" the data (and to what extent).

Third Additional Discussion

Although embodiments have been described in terms of flash memory, it is understood that presently disclosed techniques may be applied to any volatile or non-volatile memory where endurance or reliability or write-speed is data-dependent—thus, by "shaping" the distribution of memory states it is possible to realize an endurance-related and/or reliability-related and/or speed-related performance increase.

It is noted that in some embodiments, one or more of the presently-disclosed apparatus of methods for increasing flash endurance may also increase flash reliability (i.e. by reducing program-disturb upon programming flash cells) and/or may increase the speed of writing (i.e. since the states that are "favored" may be associated with faster writing).

It is noted that any controller 280 disclosed herein (either a flash controller as illustrated in the Figures or a controller for a memory device other than a flash memory device) may be implemented using any combination of hardware (for example, including a microprocessor and optionally volatile memory such as RAM or registers), firmware and/or executable code modules (for example, computer code which is stored in volatile and/or non-volatile memory and is executable by a microprocessor). Controller 280 (or 280B) may include any executable code modules and/or firmware and/or hardware element(s) including but not limited to field programmable logic array (FPLA) element(s), hard-wired logic element(s), field programmable gate array (FPGA) element(s), and application-specific integrated circuit (ASIC) element(s). Any instruction set architecture may be used in controller 280 including but not limited to reduced instruction set computer (RISC) architecture and/or complex instruction set computer (CISC) architecture.

It is further noted that any of the embodiments described above may further include receiving, sending or storing instructions and/or data that implement the operations described above in conjunction with the Figures upon a computer readable medium. Generally speaking, a computer readable medium may include storage media or memory media such as magnetic or flash or optical media, e.g. disk or CD-ROM, volatile or non-volatile media such as RAM, ROM, etc. as well as transmission media or signals such as electrical, electromagnetic or digital signals conveyed via a communication medium such as network and/or wireless links.

Figure 1B:
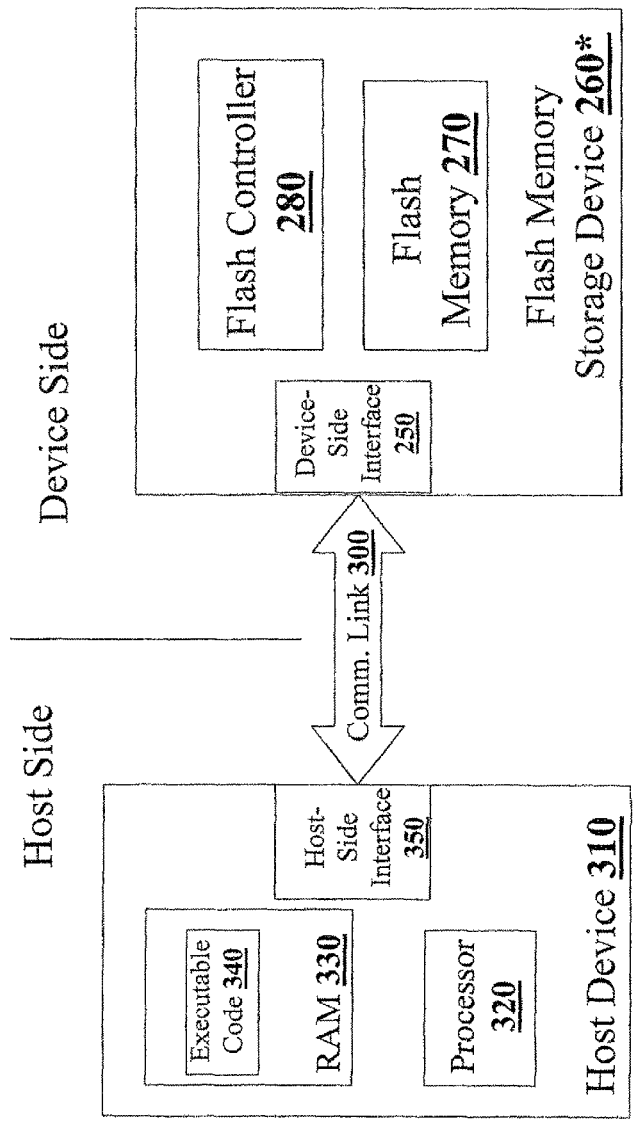
FIG. 1B is a block diagram of a flash memory storage device coupled with a host.
Figure 1C:
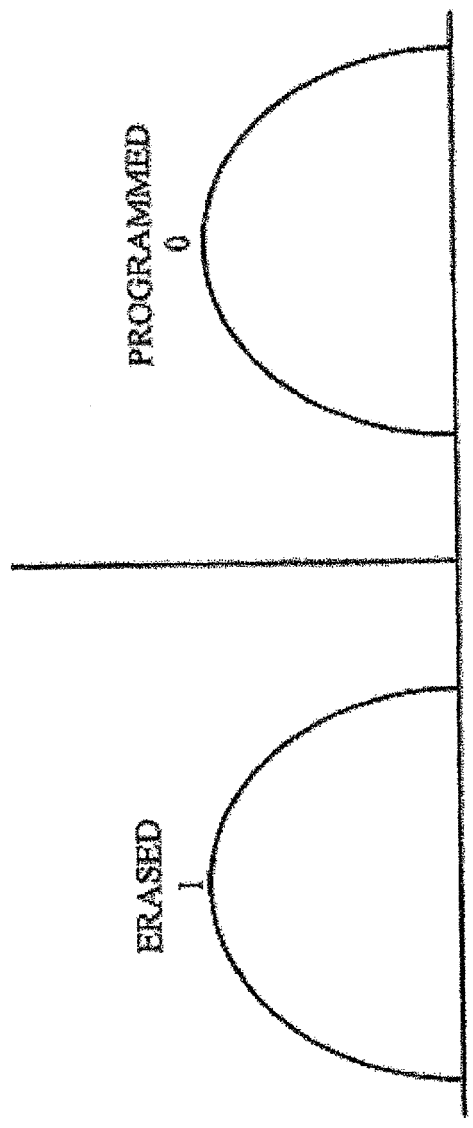
FIG. 1C is a plot of charge distributions for a SLC flash cell.
Figure 1D:
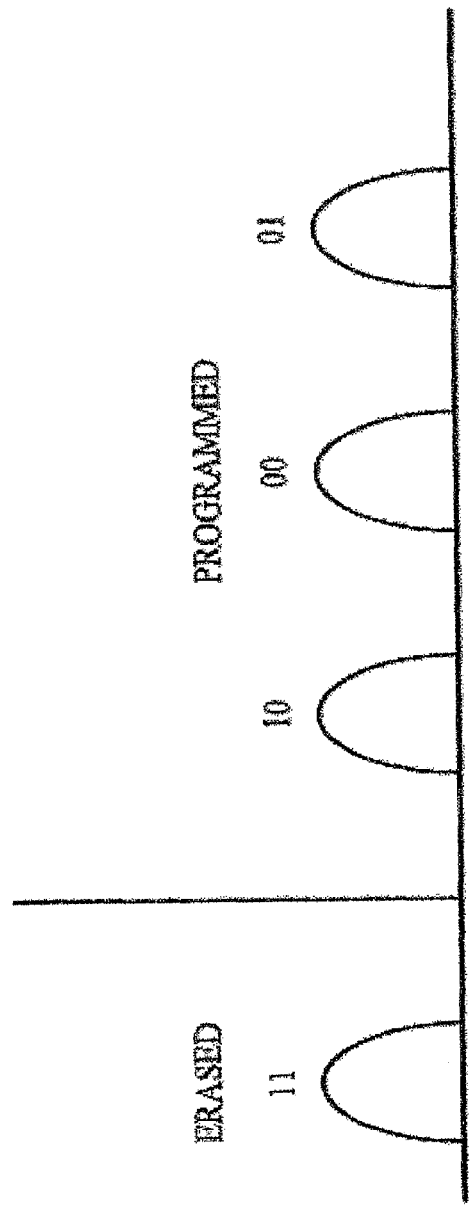
FIG. 1D is a plot of charge distributions for a two-bit MLC flash cell.
Figure 16:
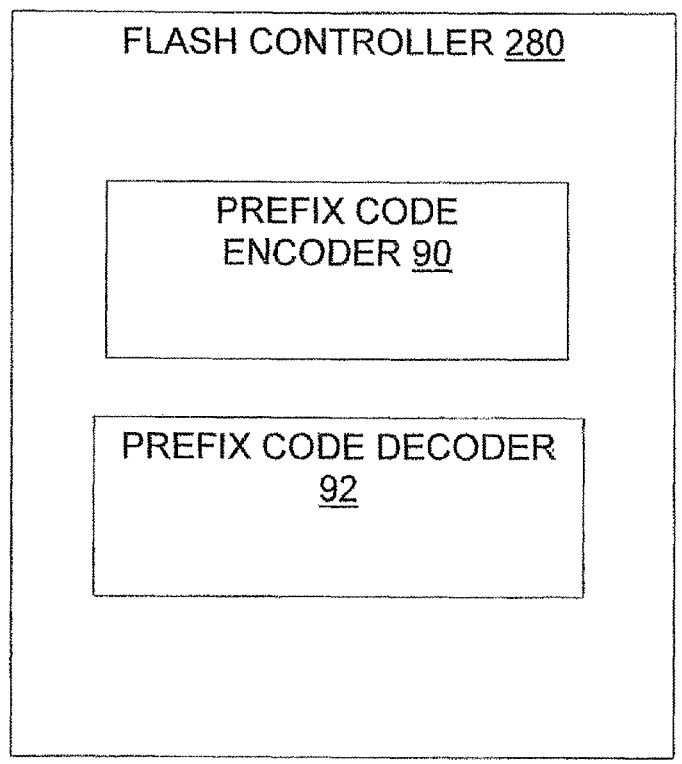
FIG. 16 is a high-level functional block diagram of an exemplary flash controller of FIG. 1A or 1B that uses shaping encoding.

Flash memory storage devices 260 and 260\* of FIGS. 1A and 1B, in addition to illustrating a conventional flash memory storage device, also illustrates a flash memory storage device that employs the technology described herein, with the understanding that flash controller 280 performs shaping encoding and decoding for enhancing the endurance of flash memory 270, as described above. FIG. 16 is a high-level functional block diagram of such a flash controller 280, showing that among the functional modules of flash controller 280 are prefix code encoder 90 of FIG. 5 and a corresponding prefix code decoder 92.

Figure 17:
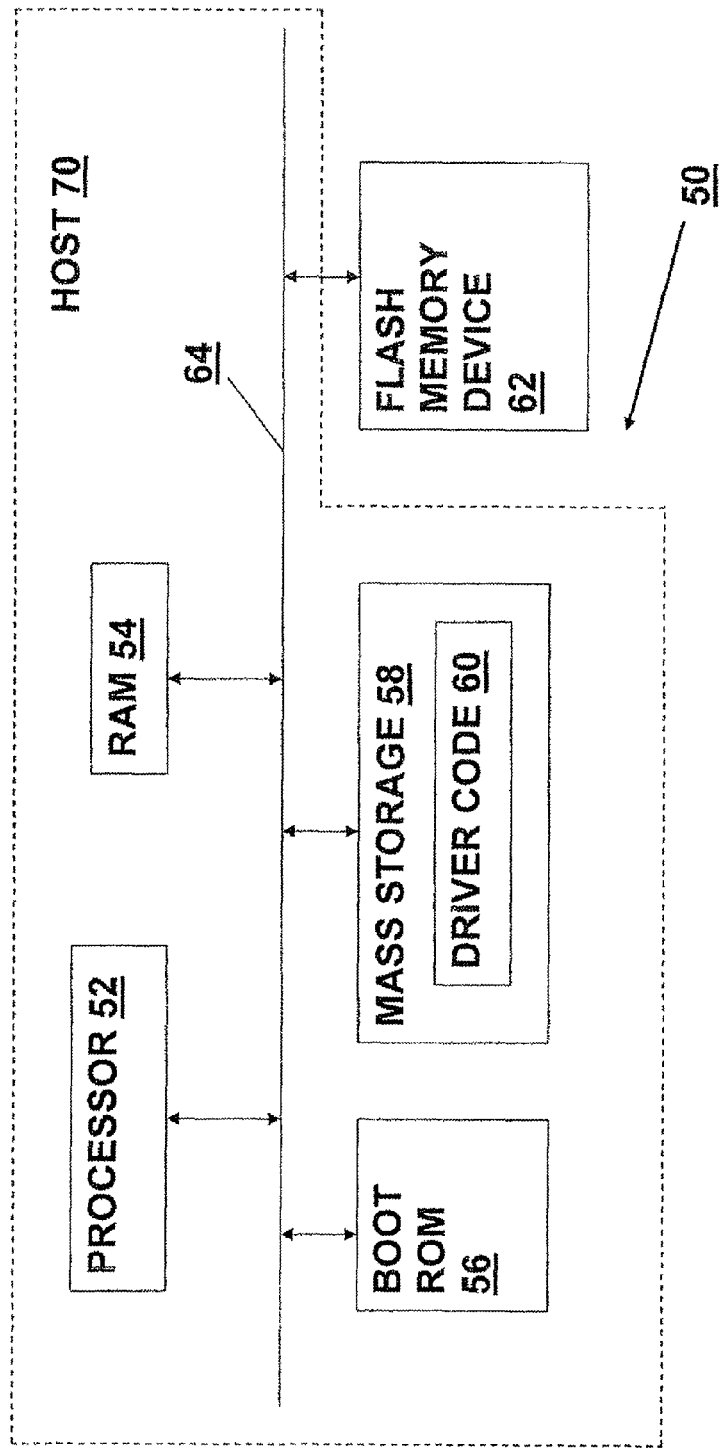
FIG. 17 is a high-level block diagram of a data storage system that uses shaping encoding.

FIG. 17 is a high-level block diagram of a system 50 that uses the technology described herein. System 50 includes a processor 52 and four memory devices: a RAM 54, a boot ROM 56, a mass storage device (hard disk) 58 and a flash memory storage device 260 or 260\* of FIGS. 1A and 1B as a flash memory device 62, all communicating via a common bus 64. In system 50, controller 280 of flash memory device 62 functions only as an interface to bus 64; the rest of the functionality of flash controller 280 of FIGS. 1A and 1B as described above is emulated by flash memory driver code 60 that is stored in mass storage device 58 and that is executed by processor 52 to interface between user applications executed by processor 52 and flash memory device 62, and to manage flash memory 270 of flash memory device 62. In addition to the conventional functionality of such flash management driver code, driver code 60 emulates the functionality of controller 280 of FIGS. 1A and 1B with respect to performing shaping encoding and decoding for enhancing the endurance of flash memory 270 as described above. Driver code 60 typically is included in operating system code for system 50 but also could be freestanding code.

The components of system 50 other than flash memory device 62 constitute a host 70 of flash memory device 62. Mass storage device 58 is an example of a computer-readable storage medium bearing computer-readable driver code for shaping encoding and decoding. Other examples of such computer-readable storage media include read-only memories such as CDs bearing such code.

All references cited herein are incorporated by reference in their entirety. Citation of a reference does not constitute an admission that the reference is prior art.

A limited number of embodiments of methods for encoding data to enhance the endurance of a memory such as a flash memory, and of a device and system that use the methods, have been described. It will be appreciated that many variations, modifications and other applications of the methods, device and system may be made.

What is claimed is:

1. A method of storing a first plurality of input bits in a plurality of memory cells, comprising:
   (a) providing a first mapping of bit patterns to cell states of the memory cells;
   (b) mapping the first plurality of input bits to a first plurality of transformed bits that is larger in number than the first plurality of input bits, using a first shaping encoding that has a downward asymptotic bias with respect to the first mapping of bit patterns to cell states;
   (c) programming at least a portion of the first sub-plurality of the memory cells to store the first plurality of transformed bits according to the first mapping of bit patterns to cell states; and
   (d) erasing the at least portion of the first sub-plurality of the memory cells before programming the at least portion of the first sub-plurality of the memory cells to store any other bits.

2. The method of claim 1, wherein the first shaping encoding has a downward asymptotic bias towards a lower half of the cell states.

3. The method of claim 1, wherein the first shaping encoding is non-linear.

4. The method of claim 3, wherein the first shaping encoding is a variable length encoding.

5. The method of claim 4, wherein the variable length encoding is a prefix encoding.

6. The method of claim 5, wherein the prefix encoding is a reverse Huffman encoding.

7. The method of claim 3, wherein the first shaping encoding is a reverse enumerative source encoding.

8. The method of claim 1, wherein the first shaping encoding is a trellis shaping encoding.

9. The method of claim 1, further comprising:
   (e) prior to the mapping of the first plurality of transformed bits:
      (i) estimating a maximum number of the memory cells of the first plurality needed to store the first plurality of transformed bits; and
      (ii) reserving the estimated maximum number of the memory cells of the first sub-plurality for storing the first plurality of transformed bits.

10. The method of claim 9, further comprising:
(f) if the number of reserved cells is too few to store the first plurality of transformed bits: performing an operation selected from the group consisting of:
  (i) storing the first plurality of input bits in at least a portion of the first-sub-plurality of the memory cells; and
  (ii) scrambling the first plurality of input bits to provide a plurality of scrambled bits, followed by using the first shaping encoding to map the scrambled bits to a plurality of transformed scrambled bits.

11. The method of claim 1, further comprising:
(e) selecting the first shaping encoding in accordance with a desired shaping scheme of the first sub-plurality of the memory cells.

12. The method of claim 1, further comprising:
(e providing a second mapping of bit patterns to cell states of the memory cells;
(f) mapping a second plurality of input bits to a second plurality of transformed bits, using a second shaping encoding that is different from the first shaping encoding; and
(g) programming at least a portion of a second sub-plurality of the memory cells to store the second plurality of transformed bits according to the second mapping of bit patterns to cell states.

13. The method of claim 12, wherein the first and second mappings of bit patterns to cell states are identical.

14. The method of claim 12, wherein the first and second mappings of bit patterns to cell states are different.

15. The method of claim 12, wherein the second shaping encoding has a downward asymptotic bias with respect to the cell states of the second mapping of bit patterns to cell states.

16. The method of claim 12, wherein the first and second shaping encodings are selected in accordance with respective properties of the first and second sub-pluralities of the memory cells.

17. The method of claim 16, wherein the respective properties of the first and second sub-pluralities of the memory cells include respective numbers of programming cycles endured by the first and second sub-pluralities of the memory cells.

18. The method of claim 1, further comprising:
(e) reading the at least portion of the first sub-plurality of memory cells, thereby obtaining a recovered first plurality of transformed bits;
(f) decoding the recovered first plurality of transformed bits relative to the first shaping encoding, thereby obtaining a recovered first plurality of input bits; and
(g) programming at least a portion of a second sub-plurality of the memory cells to store the recovered first plurality of input bits.

19. The method of claim 1, further comprising:
(e) systematic error-correction encoding the first plurality of transformed bits, thereby providing at least one redundancy bit; and
(f) programming at least a portion of a second sub-plurality of the memory cells to store the at least one redundancy bit.

20. The method of claim 19, further comprising:
(g) reading the at least portion of the first sub-plurality of the memory cells, thereby obtaining a recovered first plurality of transformed bits;
(h) reading the at least portion of the second sub-plurality of the memory cells, thereby obtaining a recovered at least one redundancy bit; and
(i) systematic error-correction-decoding the recovered first plurality of transformed bits according to the recovered at least one redundancy bit;
wherein the systematic error-correction-decoding is based at least in part on the first shaping encoding.

21. The method of claim 1, wherein said first shaping encoding includes non-systematic error-correction-encoding.

22. The method of claim 21, further comprising:
(e) reading the at least portion of the first sub-plurality of memory cells, thereby obtaining a recovered first plurality of transformed bits; and
(f) non-systematic error-correction-decoding the recovered first plurality of transformed bits relative to the first shaping encoding.

23. The method of claim 1, wherein the number of the transformed bits is at most about 1.29 times the number of input bits.

24. The method of claim 1, wherein the downward asymptotic bias exceeds 75%.

25. A memory controller, for a memory that includes a plurality of memory cells, that is operative:
(a) to provide a mapping of bit patterns to cell states of the memory cells;
(b) to store a plurality of bits in the memory cells, by:
  (i) mapping the plurality of input bits to a plurality of transformed bits that is larger in number than the plurality of input bits, using a shaping encoding that has a downward asymptotic bias with respect to the mapping of bit patterns to cell states, and
  (ii) programming at least a portion of the memory cells to store the plurality of transformed bits according to the mapping of bit patterns to cell states; and
(c) to erase the at least portion of the plurality of memory cells before programming the at least portion of the plurality of memory cells to store any other bits.

26. A memory device comprising:
(a) a memory that includes a plurality of memory cells; and
(b) the controller of claim 25.

27. A system for storing a plurality of input bits, comprising:
(a) a first memory including a plurality of memory cells; and
(b) a host, of the first memory, including:
  (i) a second memory for storing code for managing the first memory by:
    (A) providing a mapping of bit patterns to cell states of the memory cells,
    (B) mapping the plurality of input bits to a plurality of transformed bits that is larger in number than the plurality of input bits, using a shaping encoding that has a downward asymptotic bias with respect to the mapping of bit patterns to cell states,
    (C) programming at least a portion of the memory cells to store the plurality of transformed bits according to the mapping of bit patterns to cell states, and
    (D) erasing the at least portion of the plurality of memory cells before programming the at least portion of memory cells to store any other bits, and
  (ii) a processor for executing the code.

28. A computer-readable storage medium having embedded thereon computer-readable code for storing a plurality of input bits in a memory that includes plurality of memory cells, the computer-readable code comprising:
(a) program code for mapping the plurality of input bits to a plurality of transformed bits that is larger in number than the plurality of input bits, using a shaping encoding that has a downward asymptotic bias with respect to a mapping of bit patterns to cell states;

(b) program code for programming at least a portion of the memory cells to store the plurality of transformed bits according to the mapping of bit patterns to cell states; and (c) program code for erasing the at least portion of the plurality of memory cells before programming the at least portion of memory cells to store any other bits.

* * * * *